United States Patent
Chakravarty et al.

(10) Patent No.: US 10,859,627 B2
(45) Date of Patent: Dec. 8, 2020

(54) IN-FIELD SYSTEM TESTING

(71) Applicant: Intel Corporation, Santa Clara, CA (US)

(72) Inventors: Sreejit Chakravarty, San Jose, CA (US); Oscar Mendoza, Shrewsbury, MA (US); Ramasubramanian Rajamani, Cupertino, CA (US); Bryan J. Gran, Boylston, MA (US); Sorin Iacobovici, San Jose, CA (US); Neel Shah, Billerica, MA (US); Michael Neve de Mevergnies, Beaverton, OR (US); John Cruz Mejia, Hillsboro, OR (US); Amy L. Santoni, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 707 days.

(21) Appl. No.: 15/636,762

(22) Filed: Jun. 29, 2017

(65) Prior Publication Data
US 2019/0004112 A1   Jan. 3, 2019

(51) Int. Cl.
| | | |
|---|---|---|
| G01R 31/317 | (2006.01) | |
| H04L 12/26 | (2006.01) | |
| G01R 31/26 | (2020.01) | |
| H04L 12/24 | (2006.01) | |
| G01R 31/28 | (2006.01) | |

(52) U.S. Cl.
CPC ... *G01R 31/31715* (2013.01); *G01R 31/2607* (2013.01); *H04L 41/28* (2013.01); *H04L 43/0829* (2013.01); *H04L 43/0847* (2013.01); *H04L 43/50* (2013.01); *G01R 31/2856* (2013.01)

(58) Field of Classification Search
USPC .......................................................... 702/120
See application file for complete search history.

(56) References Cited

U.S. PATENT DOCUMENTS

| | | | | |
|---|---|---|---|---|
| 6,009,028 A | * | 12/1999 | Akiyama | G11C 29/16 365/189.07 |
| 6,622,272 B1 | * | 9/2003 | Haverkamp | G01R 31/31905 714/724 |
| 6,907,555 B1 | * | 6/2005 | Nomura | G11C 29/44 714/719 |
| 8,677,306 B1 | * | 3/2014 | Andreev | G06F 11/267 714/30 |
| 9,640,280 B1 | * | 5/2017 | Arora | G11C 29/38 |
| 2014/0019764 A1 | * | 1/2014 | Gopal | H04L 9/3247 713/176 |

(Continued)

*Primary Examiner* — Paul D Lee
(74) *Attorney, Agent, or Firm* — Alliance IP, LLC

(57) ABSTRACT

A processor, including: a core; system test circuitry, the system test circuitry to be locked during operational processor operation; reset circuitry including a kick-off test (KOT) input, the reset circuitry to detect a reset with the KOT input asserted, and to initiate an in-field system test (IFST) mode; a test interface controller to receive in IFST mode an encrypted test packet having a signature, verify the signature of the test packet, and decrypt the test packet; and IFST control circuitry to cause the system test circuitry to perform an IFST test according to the decrypted test packet and to log or report results.

25 Claims, 18 Drawing Sheets

(56) References Cited

U.S. PATENT DOCUMENTS

2016/0172057 A1* 6/2016 Her .................. G11C 29/38
  714/719
2016/0379013 A1* 12/2016 Ganesan ............... G06F 21/645
  713/176

* cited by examiner

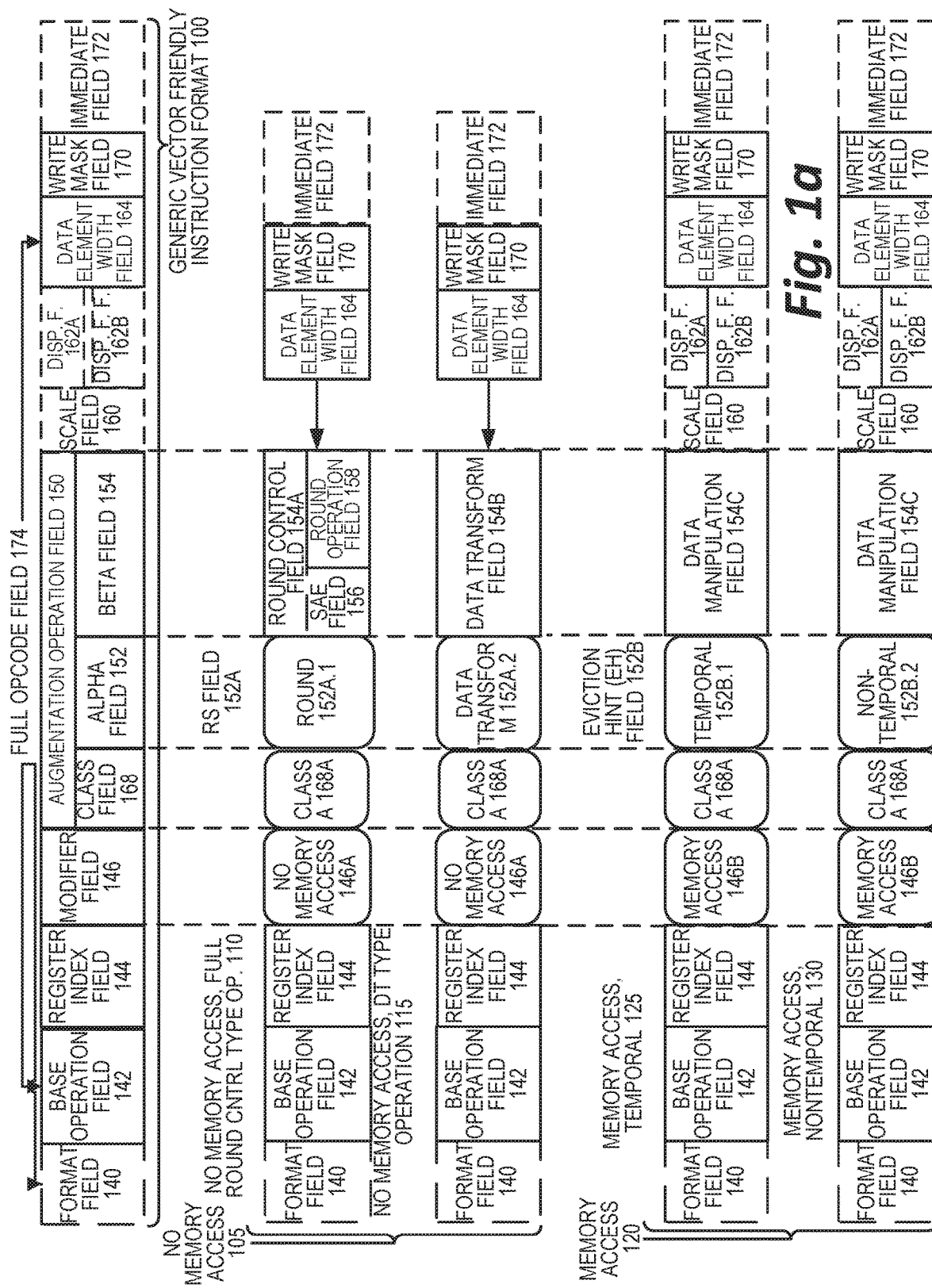

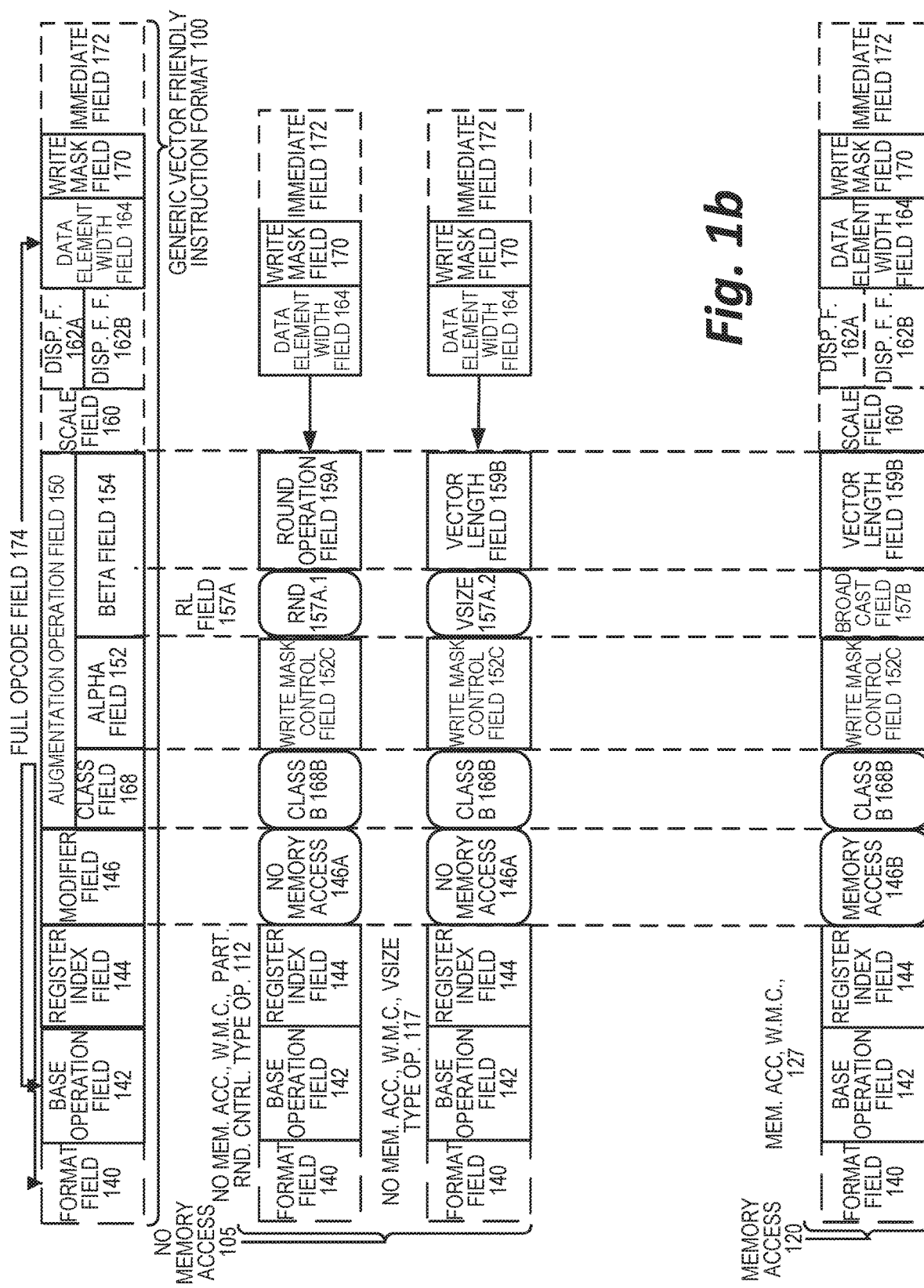

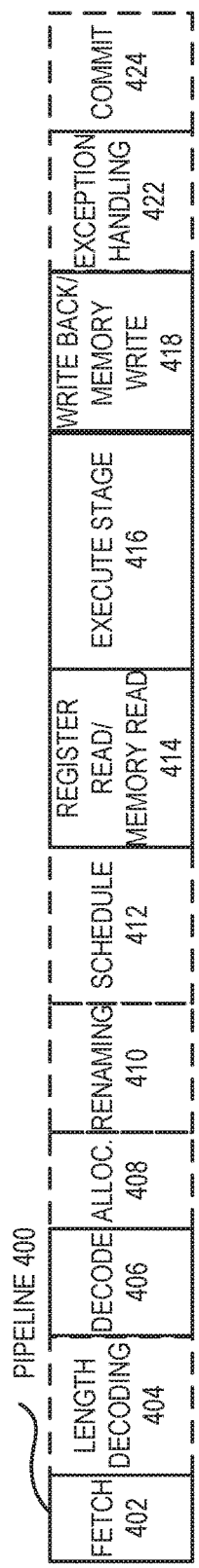
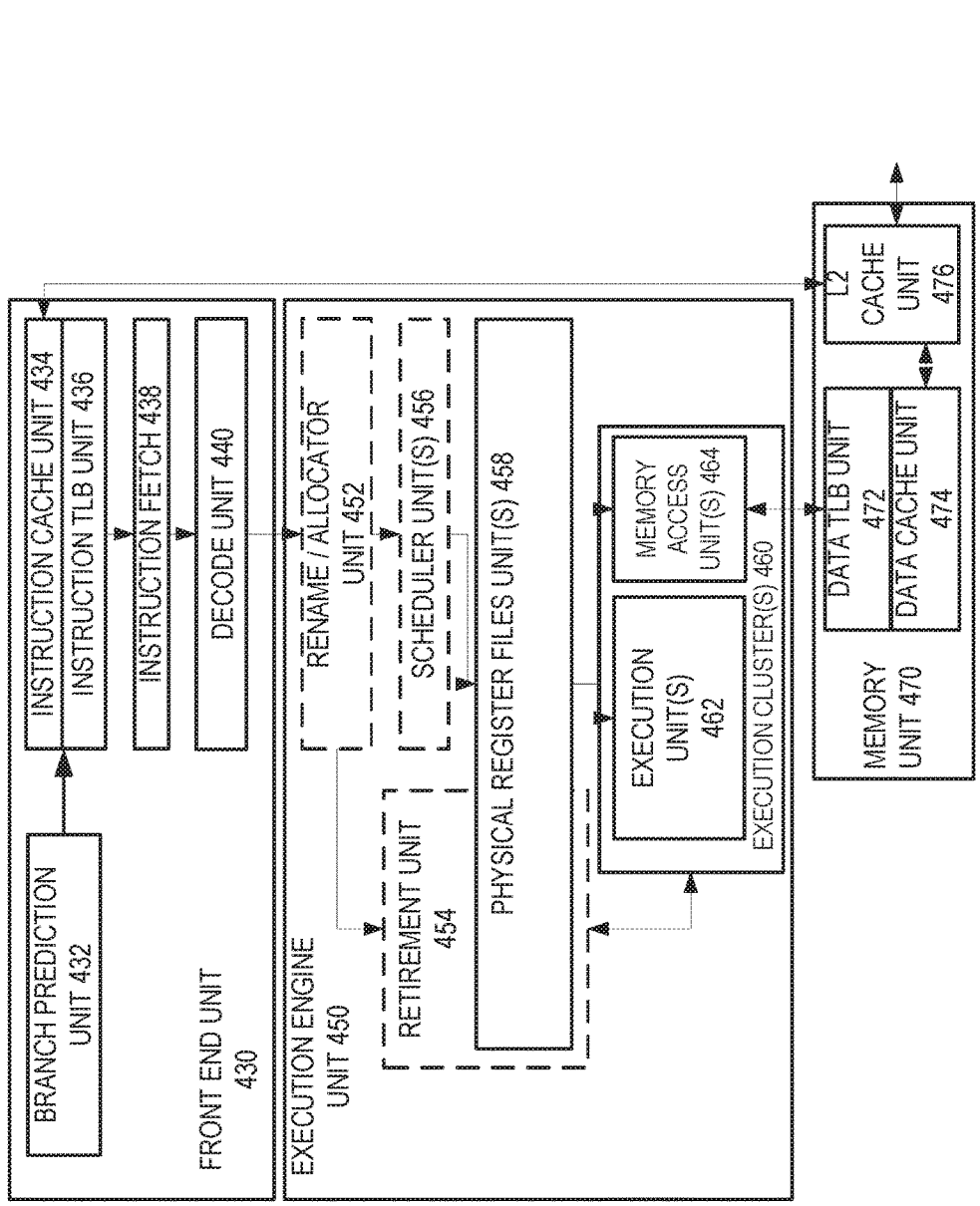
Fig. 4a
Fig. 4b

IN-FIELD SYSTEM TESTING

FIELD OF THE SPECIFICATION

This disclosure relates in general to the field of semiconductor devices, and more particularly, though not exclusively to, a system and method for in-field system testing.

BACKGROUND

Multiprocessor systems are becoming more and more common. In the modern world, compute resources play an ever more integrated role with human lives. As computers become increasingly ubiquitous, controlling everything from power grids to large industrial machines to personal computers to light bulbs, the demand for ever more capable processors increases.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

FIGS. 1a-1b are block diagrams illustrating a generic vector-friendly instruction format and instruction templates thereof according to one or more examples of the present specification.

FIG. 4a is a block diagram illustrating both an example in-order pipeline and an example register renaming an out-of-order issue/execution pipeline according to one or more examples of the present specification.

FIG. 4b is a block diagram illustrating both an example of an in-order architecture core and an example register renaming an out-of-order issue/execution architecture core to be included in a processor according to one or more examples of the present specification.

EMBODIMENTS OF THE DISCLOSURE

Figure 2A:
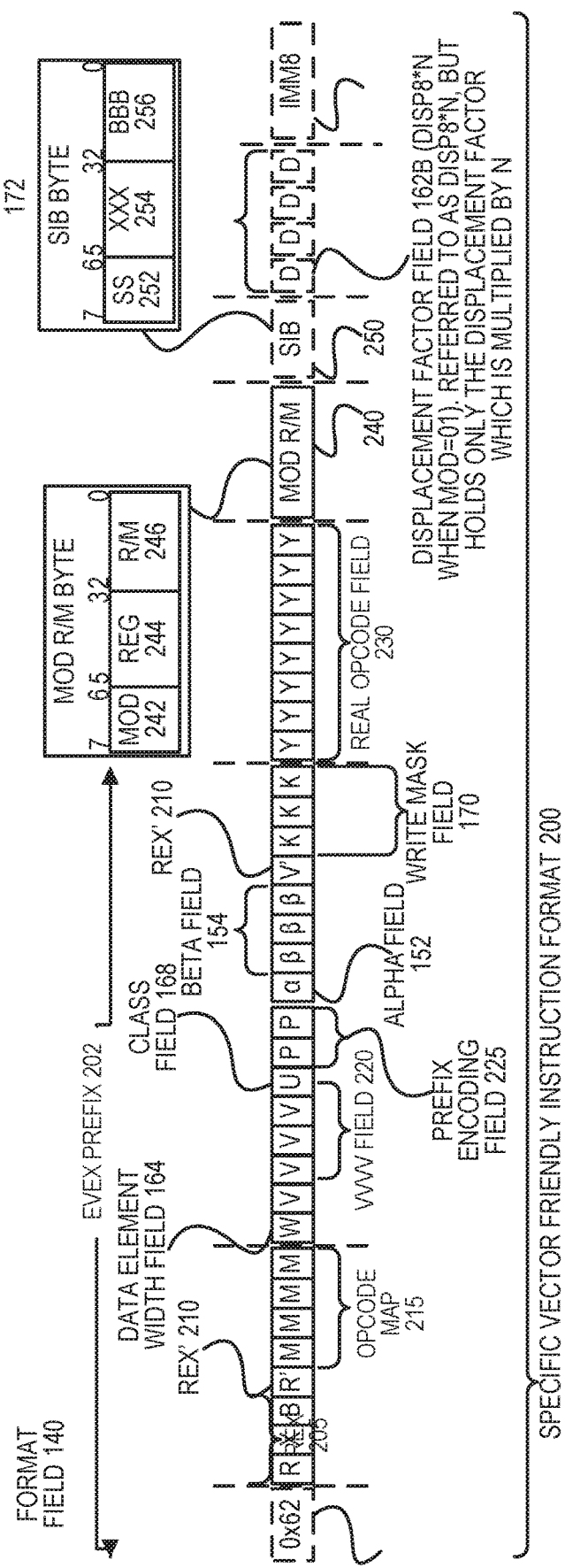
FIGS. 2a-2d are block diagrams illustrating an example specific vector-friendly instruction format according to one or more examples of the present specification.

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples. This repetition is for the purpose of simplicity and clarity and does not in itself dictate a relationship between the various embodiments and/or configurations discussed. Different embodiments may have different advantages, and no particular advantage is necessarily required of any embodiment.

As part of its manufacturing and quality control process, a CPU manufacturer may submit each manufactured wafer to a battery of tests designed to ensure that the wafer is functioning properly. These tests can cause a large percentage of the transistors, logic gates, and other components of a CPU to be operated, and the results observed at a very detailed level. This helps to ensure that processors do not go out into the field with faulty logic.

In cases where a CPU contains a large amount of trade secrets and other intellectual property, it is the nature of these tests that even the test sequences themselves can reveal a great deal of proprietary information about the processor. So it is common to perform these tests in-house as part of the manufacturing process. For example, each individual chip may be hardcoded with one half of a key pair. The other half of the key pair may be maintained by the manufacturer. To enable a test mode that exposes low-level functionality that ought not otherwise be exposed, hardware-based authentication may be performed, the appropriate interfaces may be exposed, and the tests may be run. Because exposing these interfaces otherwise can reveal intellectual property, and could also compromise certain trusted computing features of the hardware, the manufacturer may not wish to expose that functionality to its end users or customers.

However, some high-volume customers may wish to have some access to an in-field system test functionality. These customers can include, for example, operators of high performance computing (HPC) clusters, sometimes called "supercomputers." These could also include large data centers where large numbers of processors are deployed. In these cases, failures or irregularities in a single node can cause difficulty. For example, in the case of HPC, a very large mathematical operation may be split into a large number of smaller parallel compute operations. Because completion of the overall operation is dependent on each individual node timely completing its piece of the computation, failure of a node may create a bottleneck in the entire computation. If a node fails, its function may need to be taken over by another processor, and in some cases, the entire computation may need to be repeated.

Thus, in large HPC systems with thousands of individual nodes, CPU failure is a major contributor to overall system failure. It is therefore desirable to provide to operators of such systems high coverage system diagnostics that can identify and remedy CPU failures.

While some limited solutions are available, such as providing custom μcode, p-code, or v-code patches with limited coverage, these do not provide the comprehensive insight that can be provided by a true in-field system test (IFST). It can be difficult to accurately detect hardware failures using only the limited functionality of μcode, p-code, and v-code. Furthermore, even where it can be done, it can be complex and time-consuming, and much more time-consuming than can be realized with the system testing provided in high-volume manufacturing (HVM) facilities for the processors themselves.

As discussed above, HVM diagnostic testing is highly sensitive and invasive to the processor. In the case of Intel®, a so-called Intel® read unlock is required to perform the system test. For the reasons discussed above, it may not be desirable to provide customers—even high-volume customers—with the ability to so compromise the processors. Rather, it is desirable to provide such customers an on-demand IFST solution with high coverage (e.g., 95% or greater coverage of on-chip resources) that does not require either the presence of an Intel® employee or an Intel® supplied and monitored test configuration. The IFST of the present specification provides those features while still protecting the sensitive intellectual property of the chip itself, and the customer's assets that could be compromised by a compromised processor.

Embodiments of the IFST of the present specification provide dedicated hardware on-die and in-system that enable select end-users to run HVM-like tests on demand and report pass or fail information to the system level management entity, such as a home subscriber server (HSS). In this example, a test sequence may be crafted by the manufacturer, encrypted, and signed before being provided to the end-user. The encrypted and signed test content may be stored in a flash or other memory connected to a baseboard management controller (BMC). In an embodiment, the dedicated IFST hardware on the chip may segue into existing test infrastructure already present in the chip for HVM testing. This can simplify the design of the chip, and can also simplify the design of test sequences, as existing test sequences for HVM testing may be used in whole or in part for IFST.

Operationally, the HSS system manager may send a request to the BMC to place the CPU into its self-test mode, and request the BMC to execute a stored test sequence from its flash or other memory. Upon request from the BMC, the CPU enters a special mode, for example using a dedicated kickoff test (KOT) wire during a cold reset. After the CPU enters this special mode, it may disable or otherwise isolate all external interfaces except for the BMC interface for receiving test data. The CPU requests test data from the BMC, which may be sent incrementally in a packet sequence, and executes the test. Upon completion of all the tests, the CPU stores pass/fail results in a register that may be accessed via a platform environment control interface (PECI). Once all of the tests have been completed, the HSS may read the results register and execute a power cycling cold reset to clear the special test mode.

As testing demands and circumstances evolve, the battery of tests provided in the flash memory may be updated or modified by the manufacturer to meet new requirements, better conform to desired test times, conform to new CPU versions, or to otherwise respond to changing needs.

Advantageously, the IFST of the present specification provides a special diagnostic mode that isolates the CPU in a sandboxed environment. This diagnostic mode is disclosed in contrast to an "operational" mode, wherein the CPU may provide its normal operational function. During diagnostic mode, all external interfaces, including test interfaces, may be placed in an inaccessible or disabled state during the test. The reset controller halts in a state that allows HVM-like testing without exposing the CPU to security risks. Encrypted test vectors may be stored in the flash or other memory of the BMC and sent to a CPU upon request. Special on-die hardware decrypts the test data and authenticates the test data before executing them. In certain embodiments, a power cycle is required to end the special test mode, thus ensuring that non-IFST CPU operations are not compromised. An IFST status register (ISR) may hold the pass or fail information as single or multiple bit fields for each test. For example, some fields in the ISR may be simple pass or fail flags for certain tests, while other fields may include additional data, such as integer data, that provides additional information about a particular test. In some embodiments, the special ISR holding the pass/fail information for each test is readable only while the CPU is in the special IFST mode. In some embodiments, aggregate results may be reported with masking to account for intellectual property (IP) blocks that are fuse or strap disabled within the CPU. Also advantageously, the IFST functionality of the present specification enables the manufacturer to reuse HVM test contents with little or no change, thus making it easy for them to reuse their existing test batteries.

A system and method for in-field system testing will now be described with more particular reference to the attached FIGURES. It should be noted that throughout the FIGURES, certain reference numerals may be repeated to indicate that a particular device or block is wholly or substantially consistent across the FIGURES. This is not, however, intended to imply any particular relationship between the various embodiments disclosed. In certain examples, a genus of elements may be referred to by a particular reference numeral ("widget 10"), while individual species or examples of the genus may be referred to by a hyphenated numeral ("first specific widget 10-1" and "second specific widget 10-2").

Certain of the FIGURES below detail example architectures and systems to implement embodiments of the above. In some embodiments, one or more hardware components and/or instructions described above are emulated as detailed below, or implemented as software modules.

In certain examples, instruction(s) may be embodied in a "generic vector-friendly instruction format," which is detailed below. In other embodiments, another instruction format is used. The description below of the write mask registers, various data transformations (swizzle, broadcast, etc.), addressing, etc. is generally applicable to the description of the embodiments of the instruction(s) above. Additionally, example systems, architectures, and pipelines are detailed below. Embodiments of the instruction(s) above may be executed on those systems, architectures, and pipelines, but are not limited to those detailed.

An instruction set may include one or more instruction formats. A given instruction format may define various fields (e.g., number of bits, location of bits) to specify, among other things, the operation to be performed (e.g., opcode) and the operand(s) on which that operation is to be performed and/or other data field(s) (e.g., mask). Some instruction formats are further broken down though the definition of instruction templates (or subformats). For example, the instruction templates of a given instruction format may be defined to have different subsets of the instruction format's fields (the included fields are typically in the same order, but at least some have different bit positions because there are fewer fields included) and/or defined to have a given field interpreted differently. Thus, each instruction of an ISA is expressed using a given instruction format (and, if defined, in a given one of the instruction templates of that instruction format) and includes fields for specifying the operation and the operands. In one embodiment, an example ADD instruction has a specific opcode and an instruction format that includes an opcode field to specify that opcode and operand fields to select operands (source1/destination and source2); and an occurrence of this ADD instruction in an instruction stream will have specific contents in the operand fields that select specific operands. A set of SIMD extensions referred to as the advanced vector extensions (AVXs) (AVX1 and AVX2), and using the vector extensions (VEX) coding scheme has been released and/or published (e.g., see Intel® 64 and IA-32 Architectures Software Developer's Manual, September 2014; and see Intel® Advanced Vector Extensions Programming Reference, October 2014).

Example Instruction Formats

Embodiments of the instruction(s) described herein may be embodied in different formats. Additionally, example systems, architectures, and pipelines are detailed below. Embodiments of the instruction(s) may be executed on such systems, architectures, and pipelines, but are not limited to those detailed.

Generic Vector-Friendly Instruction Format

A vector-friendly instruction format is an instruction format that is suited for vector instructions (e.g., there are certain fields specific to vector operations). While embodiments are described in which both vector and scalar operations are supported through the vector-friendly instruction format, alternative embodiments use only vector operations through the vector-friendly instruction format.

FIGS. 1a-1b are block diagrams illustrating a generic vector-friendly instruction format and instruction templates thereof according to embodiments of the specification. FIG. 1a is a block diagram illustrating a generic vector-friendly instruction format and class A instruction templates thereof according to embodiments of the specification; while FIG. 1b is a block diagram illustrating the generic vector-friendly instruction format and class B instruction templates thereof according to embodiments of the specification. Specifically, a generic vector-friendly instruction format 100 for which are defined class A and class B instruction templates, both of which include no memory access 105 instruction templates and memory access 120 instruction templates. The term generic in the context of the vector-friendly instruction format refers to the instruction format not being tied to any specific instruction set.

Embodiments of the specification will be described in which the vector-friendly instruction format supports the following: a 64 byte vector operand length (or size) with 32 bit (4 byte) or 64 bit (8 byte) data element widths (or sizes) (and thus, a 64 byte vector consists of either 16 doubleword-size elements or alternatively, 8 quadword-size elements); a 64 byte vector operand length (or size) with 16 bit (2 byte) or 8 bit (1 byte) data element widths (or sizes); a 32 byte vector operand length (or size) with 32 bit (4 byte), 64 bit (8 byte), 16 bit (2 byte), or 8 bit (1 byte) data element widths (or sizes); and a 16 byte vector operand length (or size) with 32 bit (4 byte), 64 bit (8 byte), 16 bit (2 byte), or 8 bit (1 byte) data element widths (or sizes); alternative embodiments may support more, less and/or different vector operands and sizes (e.g., 256 byte vector operands) with more, less, or different data element widths (e.g., 128 bit (16 byte) data element widths).

The class A instruction templates in FIG. 1a include: 1) within the no memory access 105 instruction templates there is shown a no memory access, full round control type operation 110 instruction template and a no memory access, data transform type operation 115 instruction template; and 2) within the memory access 120 instruction templates there is shown a memory access, temporal 125 instruction template and a memory access, nontemporal 130 instruction template. The class B instruction templates in FIG. 1b include: 1) within the no memory access 105 instruction templates there is shown a no memory access, write mask control, partial round control type operation 112 instruction template and a no memory access, write mask control, VSIZE type operation 117 instruction template; and 2) within the memory access 120 instruction templates there is shown a memory access, write mask control 127 instruction template.

The generic vector-friendly instruction format 100 includes the following fields listed below in the order illustrated in FIGS. 1a-1b.

Format field 140—a specific value (an instruction format identifier value) in this field uniquely identifies the vector-friendly instruction format, and thus occurrences of instructions in the vector-friendly instruction format in instruction streams. As such, this field is optional in the sense that it is not needed for an instruction set that has only the generic vector-friendly instruction format.

Base operation field 142—its content distinguishes different base operations.

Register index field 144—its content, directly or through address generation, specifies the locations of the source and destination operands, be they in registers or in memory. These include a sufficient number of bits to select N registers from a P×Q (e.g. 32×512, 16×128, 32×1024, 64×1024) register file. While in one embodiment N may be up to three sources and one destination register, alternative embodiments may support more or fewer sources and destination registers (e.g., may support up to two sources where one of these sources also acts as the destination, may support up to three sources where one of these sources also acts as the destination, or may support up to two sources and one destination).

Modifier field 146—its content distinguishes occurrences of instructions in the generic vector instruction format that specify memory access from those that do not; that is, between no memory access 105 instruction templates and memory access 120 instruction templates. Memory access operations read and/or write to the memory hierarchy (in some cases specifying the source and/or destination addresses using values in registers), while non-memory access operations do not (e.g., the source and destinations are registers). While in one embodiment this field also selects between three different ways to perform memory address calculations, alternative embodiments may support more, fewer, or different ways to perform memory address calculations.

Augmentation operation field 150—its content distinguishes which one of a variety of different operations to be performed in addition to the base operation. This field is context specific. In one embodiment of the specification, this field is divided into a class field 168, an alpha field 152, and a beta field 154. The augmentation operation field 150 allows common groups of operations to be performed in a single instruction rather than 2, 3, or 4 instructions.

Scale field 160—its content allows for the scaling of the index field's content for memory address generation (e.g., for address generation that uses $2^{scale}*\text{index}+\text{base}$).

Displacement Field 162A—its content is used as part of memory address generation (e.g., for address generation that uses $2^{scale}*\text{index}+\text{base}+\text{displacement}$).

Displacement Factor Field 162B (note that the juxtaposition of displacement field 162A directly over displacement factor field 162B indicates one or the other is used)—its content is used as part of address generation; it specifies a displacement factor that is to be scaled by the size of a memory access (N)—where N is the number of bytes in the memory access (e.g., for address generation that uses $2^{scale}*\text{index}+\text{base}+\text{scaled displacement}$). Redundant low-order bits are ignored and hence, the displacement factor field's content is multiplied by the memory operand's total size (N) in order to generate the final displacement to be used in calculating an effective address. The value of N is determined by the processor hardware at runtime based on the full opcode field 174 (described later herein) and the data manipulation field 154C. The displacement field 162A and the displacement factor field 162B are optional in the sense that they are not used for the no memory access 105 instruction templates and/or different embodiments may implement only one or none of the two.

Data element width field 164—its content distinguishes which one of a number of data element widths is to be used (in some embodiments, for all instructions; in other embodiments, for only some of the instructions). This field is optional in the sense that it is not needed if only one data element width is supported and/or data element widths are supported using some aspect of the opcodes.

Write mask field 170—its content controls, on a per data element position basis, whether that data element position in the destination vector operand reflects the result of the base operation and augmentation operation. Class A instruction templates support merging-write masking, while class B instruction templates support both merging and zeroing-write masking. When merging, vector masks allow any set of elements in the destination to be protected from updates during the execution of any operation (specified by the base operation and the augmentation operation)—in one embodiment, preserving the old value of each element of the destination where the corresponding mask bit has a 0. In contrast, when zeroing vector masks allow any set of elements in the destination to be zeroed during the execution of any operation (specified by the base operation and the augmentation operation), in one embodiment, an element of the destination is set to 0 when the corresponding mask bit has a 0 value. A subset of this functionality is the ability to control the vector length of the operation being performed (that is, the span of elements being modified, from the first to the last one); however, it is not necessary that the elements that are modified be consecutive. Thus, the write mask field 170 allows for partial vector operations, including loads, stores, arithmetic, logical, etc. While embodiments of the specification are described in which the write mask field's 170 content selects one of a number of write mask registers that contains the write mask to be used (and thus the write mask field's 170 content indirectly identifies that masking to be performed), alternative embodiments instead or additionally allow the mask write field's 170 content to directly specify the masking to be performed.

Immediate field 172—its content allows for the specification of an immediate. This field is optional in the sense that is it not present in an implementation of the generic vector-friendly format that does not support immediate and it is not present in instructions that do not use an immediate.

Class field 168—its content distinguishes between different classes of instructions. With reference to FIGS. 1a-1b, the contents of this field select between class A and class B instructions. In FIGS. 1a-1b, rounded corner squares are used to indicate a specific value is present in a field (e.g., class A 168A and class B 168B for the class field 168 respectively in FIGS. 1a-1b).

Instruction Templates of Class A

In the case of the non-memory access 105 instruction templates of class A, the alpha field 152 is interpreted as an RS field 152A, whose content distinguishes which one of the different augmentation operation types are to be performed (e.g., round 152A.1 and data transform 152A.2 are respectively specified for the no memory access, round type operation 110 and the no memory access, data transform type operation 115 instruction templates), while the beta field 154 distinguishes which of the operations of the specified type is to be performed. In the no memory access 105 instruction templates, the scale field 160, the displacement field 162A, and the displacement scale filed 162B are not present.

No-Memory Access Instruction Templates—Full Round Control Type Operation

In the no memory access full round control type operation 110 instruction template, the beta field 154 is interpreted as a round control field 154A, whose content provides static rounding. While in the described embodiments of the specification the round control field 154A includes a suppress all floating point exceptions (SAE) field 156 and a round operation control field 158, alternative embodiments may encode both these concepts into the same field or only have one or the other of these concepts/fields (e.g., may have only the round operation control field 158).

SAE field 156—its content distinguishes whether or not to disable the exception event reporting; when the SAE field's 156 content indicates suppression is enabled, a given instruction does not report any kind of floating-point exception flag and does not raise any floating point exception handler.

Round operation control field 158—its content distinguishes which one of a group of rounding operations to perform (e.g., round-up, round-down, round-towards-zero and round-to-nearest). Thus, the round operation control field 158 allows for the changing of the rounding mode on a per instruction basis. In one embodiment of the specification where a processor includes a control register for specifying rounding modes, the round operation control field's 150 content overrides that register value.

No Memory Access Instruction Templates—Data Transform Type Operation

In the no memory access data transform type operation 115 instruction template, the beta field 154 is interpreted as a data transform field 154B, whose content distinguishes which one of a number of data transforms is to be performed (e.g., no data transform, swizzle, broadcast).

In the case of a memory access 120 instruction template of class A, the alpha field 152 is interpreted as an eviction hint field 152B, whose content distinguishes which one of the eviction hints is to be used (in FIG. 1a, temporal 152B.1 and nontemporal 152B.2 are respectively specified for the memory access, temporal 125 instruction template and the memory access, nontemporal 130 instruction template), while the beta field 154 is interpreted as a data manipulation field 154C, whose content distinguishes which one of a number of data manipulation operations (also known as primitives) is to be performed (e.g., no manipulation; broadcast; up conversion of a source; and down conversion of a destination). The memory access 120 instruction templates include the scale field 160, and optionally the displacement field 162A or the displacement scale field 162B.

Vector memory instructions perform vector loads from and vector stores to memory, with conversion support. As with regular vector instructions, vector memory instructions transfer data from/to memory in a data element-wise fashion, with the elements that are actually transferred as dictated by the contents of the vector mask that is selected as the write mask.

Memory Access Instruction Templates—Temporal

Temporal data is data likely to be reused soon enough to benefit from caching. This is, however, a hint, and different processors may implement it in different ways, including ignoring the hint entirely.

Memory Access Instruction Templates—Nontemporal

Nontemporal data is data unlikely to be reused soon enough to benefit from caching in the 1st-level cache and should be given priority for eviction. This is, however, a hint, and different processors may implement it in different ways, including ignoring the hint entirely.

Instruction Templates of Class B

In the case of the instruction templates of class B, the alpha field 152 is interpreted as a write mask control (Z) field 152C, whose content distinguishes whether the write masking controlled by the write mask field 170 should be a merging or a zeroing.

In the case of the non-memory access 105 instruction templates of class B, part of the beta field 154 is interpreted as an RL field 157A, whose content distinguishes which one of the different augmentation operation types are to be performed (e.g., round 157A.1 and vector length (VSIZE) 157A.2 are respectively specified for the no memory access, write mask control, partial round control type operation 112 instruction template and the no memory access, write mask control, VSIZE type operation 117 instruction template), while the rest of the beta field 154 distinguishes which of the operations of the specified type is to be performed. In the no memory access 105 instruction templates, the scale field 160, the displacement field 162A, and the displacement scale field 162B are not present.

In the no memory access, write mask control, partial round control type operation 110 instruction template, the rest of the beta field 154 is interpreted as a round operation field 159A and exception event reporting is disabled (a given instruction does not report any kind of floating-point exception flag and does not raise any floating point exception handler).

Round operation control field 159A—just as round operation control field 158, its content distinguishes which one of a group of rounding operations to perform (e.g., round-up, round-down, round-towards-zero and round-to-nearest). Thus, the round operation control field 159A allows for the changing of the rounding mode on a per instruction basis. In one embodiment of the specification where a processor includes a control register for specifying rounding modes, the round operation control field's 150 content overrides that register value.

In the no memory access, write mask control, VSIZE type operation 117 instruction template, the rest of the beta field 154 is interpreted as a vector length field 159B, whose content distinguishes which one of a number of data vector lengths is to be performed on (e.g., 128, 256, or 512 byte).

In the case of a memory access 120 instruction template of class B, part of the beta field 154 is interpreted as a broadcast field 157B, whose content distinguishes whether or not the broadcast type data manipulation operation is to be performed, while the rest of the beta field 154 is interpreted by the vector length field 159B. The memory access 120 instruction templates include the scale field 160, and optionally the displacement field 162A or the displacement scale field 162B.

With regard to the generic vector-friendly instruction format 100, a full opcode field 174 is shown including the format field 140, the base operation field 142, and the data element width field 164. While one embodiment is shown where the full opcode field 174 includes all of these fields, the full opcode field 174 includes less than all of these fields in embodiments that do not support all of them. The full opcode field 174 provides the operation code (opcode).

The augmentation operation field 150, the data element width field 164, and the write mask field 170 allow these features to be specified on a per instruction basis in the generic vector-friendly instruction format.

The combination of write mask field and data element width field create typed instructions in that they allow the mask to be applied based on different data element widths.

The various instruction templates found within class A and class B are beneficial in different situations. In some embodiments of the specification, different processors or different cores within a processor may support only class A, only class B, or both classes. For instance, a high performance general purpose out-of-order core intended for general-purpose computing may support only class B, a core intended primarily for graphics and/or scientific (throughput) computing may support only class A, and a core intended for both may support both (of course, a core that has some mix of templates and instructions from both classes but not all templates and instructions from both classes is within the purview of the specification). Also, a single processor may include multiple cores, all of which support the same class or in which different cores support different classes. For instance, in a processor with separate graphics and general purpose cores, one of the graphics cores intended primarily for graphics and/or scientific computing may support only class A, while one or more of the general purpose cores may be high performance general purpose cores with out-of-order execution and register renaming intended for general-purpose computing that supports only class B. Another processor that does not have a separate graphics core may include one more general purpose in-order or out-of-order cores that support both class A and class B. Of course, features from one class may also be implemented in the other class in different embodiments of the specification. Programs written in a high level language would be put (e.g., just in time compiled or statically compiled) into an variety of different executable forms, including: 1) a form having only instructions of the class or classes supported by the target processor for execution; or 2) a form having alternative routines written using different combinations of the instructions of all classes and having control flow code that selects the routines to execute based on the instructions supported by the processor which is currently executing the code.

Example Specific Vector-Friendly Instruction Format

FIGS. 2a-2d are block diagrams illustrating an example specific vector-friendly instruction format 200 according to one or more examples of the present specification. FIGS. 2a-2d show a specific vector-friendly instruction format 200 that is specific in the sense that it specifies the location, size, interpretation, and order of the fields, as well as values for some of those fields. The specific vector-friendly instruction format 200 may be used to extend the x86 instruction set, and thus some of the fields are similar or the same as those used in the existing x86 instruction set and extension thereof (e.g., AVX). This format remains consistent with the prefix encoding field, real opcode byte field, MOD R/M field, SIB field, displacement field, and immediate fields of the existing x86 instruction set with extensions. The fields from FIGS. 1a and 1b into which the fields from FIGS. 2a-2d map are illustrated.

It should be understood that, although embodiments of the specification are described with reference to the specific vector-friendly instruction format 200 in the context of the generic vector-friendly instruction format 100 for illustrative purposes, the present specification is not limited to the specific vector-friendly instruction format 200 except where claimed. For example, the generic vector-friendly instruction format 100 contemplates a variety of possible sizes for the various fields, while the specific vector-friendly instruction format 200 is shown as having fields of specific sizes. By way of particular example, while the data element width field 164 is illustrated as a one bit field in the specific vector-friendly instruction format 200, the present specification is not so limited (that is, the generic vector-friendly instruction format 100 contemplates other sizes of the data element width field 164).

The generic vector-friendly instruction format 100 includes the following fields listed below in the order illustrated in FIG. 2a.

EVEX Prefix (Bytes 0-3) 202—is encoded in a four-byte form.

Format Field 140 (EVEX Byte 0, bits [7:0])—the first byte (EVEX Byte 0) is the format field 140 and it contains 0x62 (the unique value used for distinguishing the vector-friendly instruction format in one embodiment).

The second through fourth bytes (EVEX Bytes 1-3) include a number of bit fields providing specific capability.

REX field 205 (EVEX Byte 1, bits [7-5])—consists of an EVEX.R bit field (EVEX Byte 1, bit [7]-R), EVEX.X bit field (EVEX byte 1, bit [6]-X), and 157BEX byte 1, bit[5]-B). The EVEX.R, EVEX.X, and EVEX.B bit fields provide the same functionality as the corresponding VEX bit fields, and are encoded using 1s complement form, i.e. ZMM0 is encoded as 1111B, ZMM15 is encoded as 0000B. Other fields of the instructions encode the lower three bits of the register indexes as is known in the art (rrr, xxx, and bbb), so that Rrrr, Xxxx, and Bbbb may be formed by adding EVEX.R, EVEX.X, and EVEX.B.

REX' field 110—this is the first part of the REX' field 110 and is the EVEX.R' bit field (EVEX Byte 1, bit [4]-R') that is used to encode either the upper 16 or lower 16 of the extended 32 register set. In one embodiment, this bit, along with others as indicated below, is stored in bit inverted format to distinguish (in the well-known x86 32-bit mode) from the BOUND instruction, whose real opcode byte is 62, but does not accept in the MOD RIM field (described below) the value of 11 in the MOD field; other embodiments do not store this and the other indicated bits below in the inverted format. A value of 1 is used to encode the lower 16 registers. In other words, R'Rrrr is formed by combining EVEX.R', EVEX.R, and the other RRR from other fields.

Opcode map field 215 (EVEX byte 1, bits [3:0]-mmmm)—its content encodes an implied leading opcode byte (0F, 0F 38, or 0F 3).

Data element width field 164 (EVEX byte 2, bit [7]-W)—is represented by the notation EVEX.W. EVEX.W is used to define the granularity (size) of the datatype (either 32-bit data elements or 64-bit data elements).

EVEX.vvvv 220 (EVEX Byte 2, bits [6:3]-vvvv)—the role of EVEX.vvvv may include the following: 1) EVEX.vvvv encodes the first source register operand, specified in inverted (1s complement) form and is valid for instructions with 2 or more source operands; 2) EVEX.vvvv encodes the destination register operand, specified in 1s complement form for certain vector shifts; or 3) EVEX.vvvv does not encode any operand, the field is reserved and should contain 1111b. Thus, EVEX.vvvv field 220 encodes the 4 low-order bits of the first source register specifier stored in inverted (1s complement) form. Depending on the instruction, an extra different EVEX bit field is used to extend the specifier size to 32 registers.

EVEX.U 168 Class field (EVEX byte 2, bit [2]-U)—if EVEX.U=0, it indicates class A or EVEX.U0; if EVEX.U=1, it indicates class B or EVEX.U1.

Prefix encoding field 225 (EVEX byte 2, bits [1:0]-pp)—provides additional bits for the base operation field. In addition to providing support for the legacy SSE instructions in the EVEX prefix format, this also has the benefit of compacting the SIMD prefix (rather than requiring a byte to express the SIMD prefix, the EVEX prefix requires only 2 bits). In one embodiment, to support legacy SSE instructions that use an SIMD prefix (66H, F2H, F3H) in both the legacy format and in the EVEX prefix format, these legacy SIMD prefixes are encoded into the SIMD prefix encoding field; and at runtime are expanded into the legacy SIMD prefix prior to being provided to the decoder's PLA (so the PLA can execute both the legacy and EVEX format of these legacy instructions without modification). Although newer instructions could use the EVEX prefix encoding field's content directly as an opcode extension, certain embodiments expand in a similar fashion for consistency but allow for different meanings to be specified by these legacy SIMD prefixes. An alternative embodiment may redesign the PLA to support the 2 bit SIMD prefix encodings, and thus not require the expansion.

Alpha field 152 (EVEX byte 3, bit [7]-EH; also known as EVEX.eh, EVEX.rs, EVEX.rl, EVEX.write mask control, and EVEX.n; also illustrated with α)—as previously described, this field is context specific.

Beta field 154 (EVEX byte 3, bits [6:4]-SSS, also known as EVEX.$s_{2-0}$, EVEX.$r_{2-0}$, EVEX.rr1, EVEX.LL0, EVEX.LLB; also illustrated with βββ)—as previously described, this field is context specific.

REX' field 110—this is the remainder of the REX' field and is the EVEX.V' bit field (EVEX Byte 3, bit [3]-V') that may be used to encode either the upper 16 or lower 16 of the extended 32 register set. This bit is stored in bit inverted format. A value of 1 is used to encode the lower 16 registers. In other words, V'VVVV is formed by combining EVEX.V', EVEX.vvvv.

Write mask field 170 (EVEX byte 3, bits [2:0]-kkk)—its content specifies the index of a register in the write mask registers as previously described. In one embodiment, the specific value EVEX.kkk=000 has a special behavior implying no write mask is used for the particular instruction (this may be implemented in a variety of ways including the use of a write mask hardwired to all ones or hardware that bypasses the masking hardware).

Real Opcode Field 230 (Byte 4) is also known as the opcode byte. Part of the opcode is specified in this field.

MOD R/M Field 240 (Byte 5) includes MOD field 242, Reg field 244, and R/M field 246. As previously described, the MOD field's 242 content distinguishes between memory access and non-memory access operations. The role of Reg field 244 can be summarized to two situations: encoding either the destination register operand or a source register operand, or be treated as an opcode extension and not used to encode any instruction operand. The role of R/M field 246 may include the following: encoding the instruction operand that references a memory address, or encoding either the destination register operand or a source register operand.

Scale, Index, Base (SIB) Byte (Byte 6)—as previously described, the scale field's 150 content is used for memory address generation. SIB.xxx 254 and SIB.bbb 256—the contents of these fields have been previously referred to with regard to the register indexes Xxxx and Bbbb.

Displacement field 162A (Bytes 7-10)—when MOD field 242 contains 10, bytes 7-10 are the displacement field 162A, and it works the same as the legacy 32-bit displacement (disp32) and works at byte granularity.

Displacement factor field 162B (Byte 7)—when MOD field 242 contains 01, byte 7 is the displacement factor field 162B. The location of this field is the same as that of the legacy x86 instruction set 8-bit displacement (disp8), which works at byte granularity. Since disp8 is sign extended, it can only address between 128 and 127-byte offsets; in terms of 64 byte cache lines, disp8 uses 8 bits that can be set to only four really useful values −128, −64, 0, and 64; since a greater range is often needed, disp32 is used; however, disp32 requires 4 bytes. In contrast to disp8 and disp32, the displacement factor field 162B is a reinterpretation of disp8; when using displacement factor field 162B, the actual displacement is determined by the content of the displacement factor field multiplied by the size of the memory operand access (N). This type of displacement is referred to as disp8*N.

This reduces the average instruction length (a single byte used for the displacement but with a much greater range). Such compressed displacement is based on the assumption that the effective displacement is a multiple of the granularity of the memory access, and hence, the redundant low-order bits of the address offset do not need to be encoded. In other words, the displacement factor field 162B substitutes the legacy x86 instruction set 8-bit displacement. Thus, the displacement factor field 162B is encoded the same way as an x86 instruction set 8-bit displacement (so no changes in the ModRM/SIB encoding rules) with the only exception that disp8 is overloaded to disp8*N. In other words, there are no changes in the encoding rules or encoding lengths but only in the interpretation of the displacement value by hardware (which needs to scale the displacement by the size of the memory operand to obtain a byte-wise address offset). Immediate field 172 operates as previously described.

Full Opcode Field

Figure 2B:
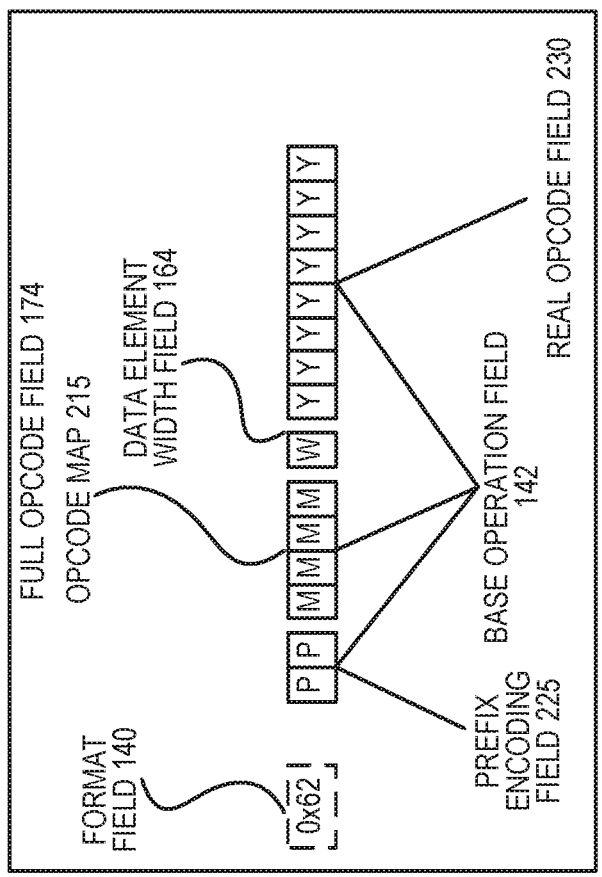

FIG. 2b is a block diagram illustrating the fields of the specific vector-friendly instruction format 200 that make up the full opcode field 174 according to one embodiment. Specifically, the full opcode field 174 includes the format field 140, the base operation field 142, and the data element width (W) field 164. The base operation field 142 includes the prefix encoding field 225, the opcode map field 215, and the real opcode field 230.

Register Index Field

Figure 2C:
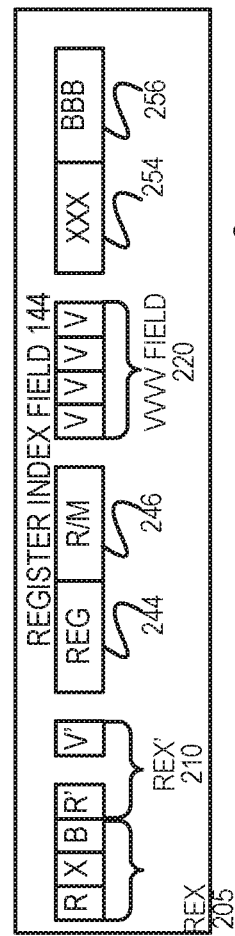

FIG. 2c is a block diagram illustrating the fields of the specific vector-friendly instruction format 200 that make up the register index field 144 according to one embodiment. Specifically, the register index field 144 includes the REX field 205, the REX' field 210, the MODR/M.reg field 244, the MODR/M.r/m field 246, the VVVV field 220, xxx field 254, and the bbb field 256.

Augmentation Operation Field

Figure 2D:
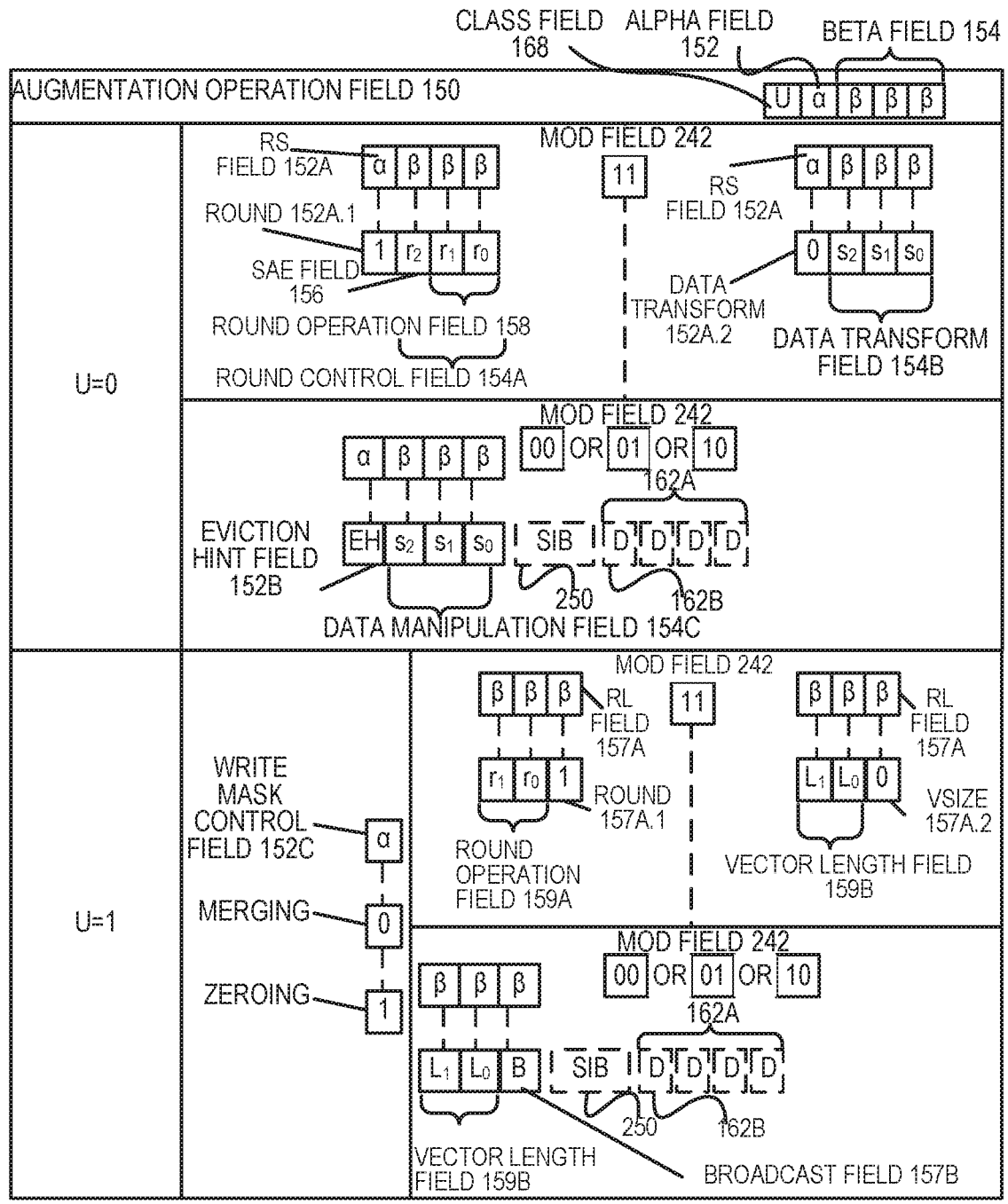

FIG. 2d is a block diagram illustrating the fields of the specific vector-friendly instruction format 200 that make up the augmentation operation field 150 according to one embodiment. When the class (U) field 168 contains 0, it signifies EVEX.U0 (class A 168A); when it contains 1, it signifies EVEX.U1 (class B 168B). When U=0 and the MOD field 242 contains 11 (signifying a no memory access operation), the alpha field 152 (EVEX byte 3, bit [7]-EH) is interpreted as the rs field 152A. When the rs field 152A contains a 1 (round 152A.1), the beta field 154 (EVEX byte 3, bits [6:4]-SSS) is interpreted as the round control field 154A. The round control field 154A includes a one bit SAE field 156 and a two bit round operation field 158. When the rs field 152A contains a 0 (data transform 152A.2), the beta field 154 (EVEX byte 3, bits [6:4]-SSS) is interpreted as a three bit data transform field 154B. When U=0 and the MOD field 242 contains 00, 01, or 10 (signifying a memory access operation), the alpha field 152 (EVEX byte 3, bit [7]-EH) is interpreted as the eviction hint (EH) field 152B and the beta field 154 (EVEX byte 3, bits [6:4]-SSS) is interpreted as a three bit data manipulation field 154C.

When U=1, the alpha field 152 (EVEX byte 3, bit [7]-EH) is interpreted as the write mask control (Z) field 152C. When U=1 and the MOD field 242 contains 11 (signifying a no memory access operation), part of the beta field 154 (EVEX byte 3, bit [4]-$S_0$) is interpreted as the RL field 157A; when it contains a 1 (round 157A.1) the rest of the beta field 154 (EVEX byte 3, bit [6-5]-$S_{2-1}$) is interpreted as the round operation field 159A, while when the RL field 157A contains a 0 (VSIZE 157.A2) the rest of the beta field 154 (EVEX byte 3, bit [6-5]-$S_{2-1}$) is interpreted as the vector length field 159B (EVEX byte 3, bit [6-5]-$L_{1-0}$). When U=1 and the MOD field 242 contains 00, 01, or 10 (signifying a memory access operation), the beta field 154 (EVEX byte 3, bits [6:4]-SSS) is interpreted as the vector length field 159B (EVEX byte 3, bit [6-5]-$L_{1-0}$) and the broadcast field 157B (EVEX byte 3, bit [4]-B).

Example Register Architecture

Figure 3:
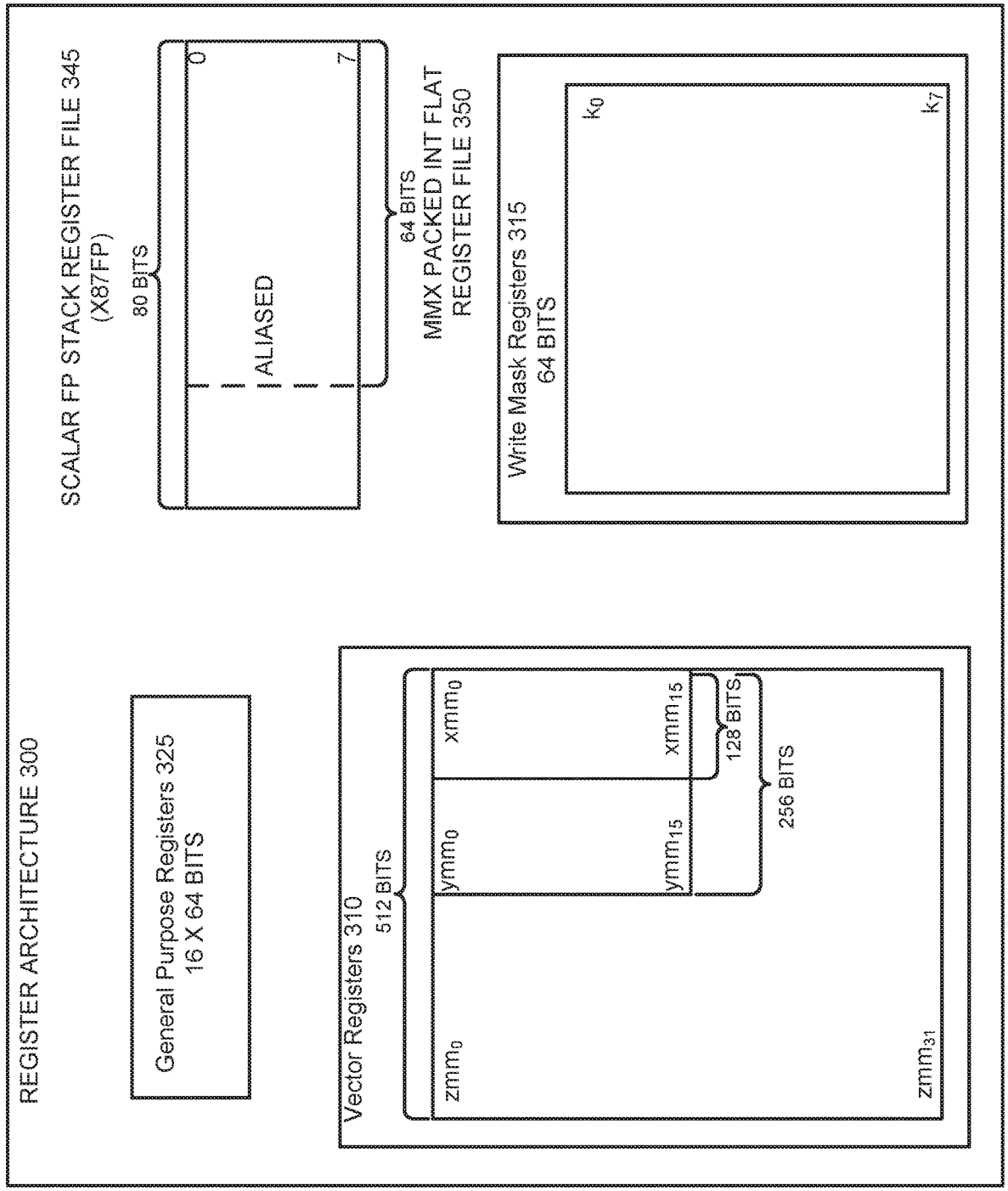
FIG. 3 is a block diagram of a register architecture according to one or more examples of the present specification.

FIG. 3 is a block diagram of a register architecture 300 according to one embodiment. In the embodiment illustrated, there are 32 vector registers 310 that are 512 bits wide; these registers are referenced as zmm0 through zmm31. The lower order 256 bits of the lower 16 zmm registers are overlaid on registers ymm0-16. The lower order 128 bits of the lower 16 zmm registers (the lower order 128 bits of the ymm registers) are overlaid on registers xmm0-15. The specific vector-friendly instruction format 200 operates on these overlaid register files as illustrated in the below tables.

| Adjustable Vector Length | Class | Operations | Registers |
| --- | --- | --- | --- |
| Instruction Templates that do not include the vector length field 159B | A (FIG. 1A; U = 0) | 110, 115, 125, 130 | zmm registers (the vector length is 64 byte) |
| | B (FIG. 1B; U = 1) | 112 | zmm registers (the vector length is 64 byte) |
| Instruction templates that do include the vector length field 159B | B (FIG. 1B; U = 1) | 117, 127 | zmm, ymm, or xmm registers (the vector length is 64 byte, 32 byte, or 16 byte) depending on the vector length field 159B |

In other words, the vector length field 159B selects between a maximum length and one or more other shorter lengths, where each such shorter length is half the length of the preceding length; and instruction templates without the vector length field 159B operate on the maximum vector length. Further, in one embodiment, the class B instruction templates of the specific vector-friendly instruction format 200 operate on packed or scalar single/double-precision floating point data and packed or scalar integer data. Scalar operations are operations performed on the lowest order data element position in a zmm/ymm/xmm register; the higher order data element positions are either left the same as they were prior to the instruction or zeroed depending on the embodiment.

Write mask registers 315—in the embodiment illustrated, there are 8 write mask registers (k0 through k7), each 64 bits in size. In an alternate embodiment, the write mask registers 315 are 16 bits in size. As previously described, in one embodiment, the vector mask register k0 cannot be used as a write mask; when the encoding that would normally indicate k0 is used for a write mask, it selects a hardwired write mask of 0xFFFF, effectively disabling write masking for that instruction.

General-purpose registers 325—in the embodiment illustrated, there are sixteen 64-bit general-purpose registers that are used along with the existing x86 addressing modes to address memory operands. These registers are referenced by the names RAX, RBX, RCX, RDX, RBP, RSI, RDI, RSP, and R8 through R15.

Scalar floating point stack register file (x87 stack) 345, on which is aliased the MMX packed integer flat register file 350—in the embodiment illustrated, the x87 stack is an eight-element stack used to perform scalar floating-point operations on 32/64/80-bit floating point data using the x87 instruction set extension; while the MMX registers are used to perform operations on 64-bit packed integer data, as well as to hold operands for some operations performed between the MMX and XMM registers.

Other embodiments may use wider or narrower registers. Additionally, other embodiments may use more, less, or different register files and registers.

Example Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific throughput. Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Example core architectures are described next, followed by descriptions of example processors and computer architectures.

Example Core Architectures

In-Order and Out-of-Order Core Block Diagram

FIG. 4a is a block diagram illustrating both an example in-order pipeline and an example register renaming, out-of-order issue/execution pipeline. FIG. 4b is a block diagram illustrating both an embodiment of an in-order architecture core and an example register renaming, out-of-order issue/execution architecture core to be included in a processor. The solid lined boxes in FIGS. 4a-4b illustrate the in-order pipeline and in-order core, while the optional addition of the dashed, lined boxes illustrates the register renaming, out-of-order issue/execution pipeline and core. Given that the in-order aspect is a subset of the out-of-order aspect, the out-of-order aspect will be described.

In FIG. 4a, a processor pipeline 400 includes a fetch stage 402, a length decode stage 404, a decode stage 406, an allocation stage 408, a renaming stage 410, a scheduling (also known as a dispatch or issue) stage 412, a register read/memory read stage 414, an execute stage 416, a write back/memory write stage 418, an exception handling stage 422, and a commit stage 424.

FIG. 4b shows processor core 490 including a front end unit 430 coupled to an execution engine unit 450, and both are coupled to a memory unit 470. The core 490 may be a reduced instruction set computing (RISC) core, a complex instruction set computing (CISC) core, a very long instruction word (VLIW) core, or a hybrid or alternative core type. As yet another option, the core 490 may be a special-purpose core, such as, for example, a network or communication core, compression engine, coprocessor core, general purpose computing graphics processing unit (GPGPU) core, graphics core, or the like.

The front end unit 430 includes a branch prediction unit 432 coupled to an instruction cache unit 434, which is coupled to an instruction translation lookaside buffer (TLB) 436, which is coupled to an instruction fetch unit 438, which is coupled to a decode unit 440. The decode unit 440 (or decoder) may decode instructions, and generate as an output one or more micro-operations, micro-code entry points, microinstructions, other instructions, or other control signals, which are decoded from, or which otherwise reflect, or are derived from, the original instructions. The decode unit 440 may be implemented using various different mechanisms. Examples of suitable mechanisms include, but are not limited to, look-up tables, hardware implementations, programmable logic arrays (PLAs), microcode read only memories (ROMs), etc. In one embodiment, the core 490 includes a microcode ROM or other medium that stores microcode for certain macroinstructions (e.g., in decode unit 440 or otherwise within the front end unit 430). The decode unit 440 is coupled to a rename/allocator unit 452 in the execution engine unit 450.

The execution engine unit 450 includes the rename/allocator unit 452 coupled to a retirement unit 454 and a set of one or more scheduler unit(s) 456. The scheduler unit(s) 456 represents any number of different schedulers, including reservation stations, central instruction window, etc. The scheduler unit(s) 456 is coupled to the physical register file(s) unit(s) 458. Each of the physical register file(s) units 458 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 458 comprises a vector registers unit, a write mask registers unit, and a scalar registers unit. These register units may provide architectural vector registers, vector mask registers, and general purpose registers. The physical register file(s) unit(s) 458 is overlapped by the retirement unit 454 to illustrate various ways in which register renaming and out-of-order execution may be implemented (e.g., using a reorder buffer(s) and a retirement register file(s); using a future file(s), a history buffer(s), and a retirement register file(s); using register maps and a pool of registers; etc.). The retirement unit 454 and the physical register file(s) unit(s) 458 are coupled to the execution cluster(s) 460. The execution cluster(s) 460 includes a set of one or more execution units 462 and a set of one or more memory access units 464. The execution units 462 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 456, physical register file(s) unit(s) 458, and execution cluster(s) 460 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 464). It should also be understood that where separate pipelines are used, one or more of these pipelines may be out-of-order issue/execution and the rest in-order.

The set of memory access units 464 is coupled to the memory unit 470, which includes a data TLB unit 472 coupled to a data cache unit 474 coupled to a level 2 (L2) cache unit 476. In one embodiment, the memory access units 464 may include a load unit, a store address unit, and a store data unit, each of which is coupled to the data TLB unit 472 in the memory unit 470. The instruction cache unit 434 is further coupled to a level 2 (L2) cache unit 476 in the memory unit 470. The L2 cache unit 476 is coupled to one or more other levels of cache and eventually to a main memory.

By way of example, the register renaming, out-of-order issue/execution core architecture may implement the pipeline 400 as follows: 1) the instruction fetch 438 performs the fetch and length decoding stages 402 and 404; 2) the decode unit 440 performs the decode stage 406; 3) the rename/allocator unit 452 performs the allocation stage 408 and renaming stage 410; 4) the scheduler unit(s) 456 performs the schedule stage 412; 5) the physical register file(s) unit(s) 458 and the memory unit 470 perform the register read/memory read stage 414; the execution cluster 460 performs the execute stage 416; 6) the memory unit 470 and the physical register file(s) unit(s) 458 perform the write back/memory write stage 418; 7) various units may be involved in the exception handling stage 422; and 8) the retirement unit 454 and the physical register file(s) unit(s) 458 perform the commit stage 424.

The core 490 may support one or more instruction sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 490 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 434/474 and a shared L2 cache unit 476, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Example In-Order Core Architecture

Figure 5B:
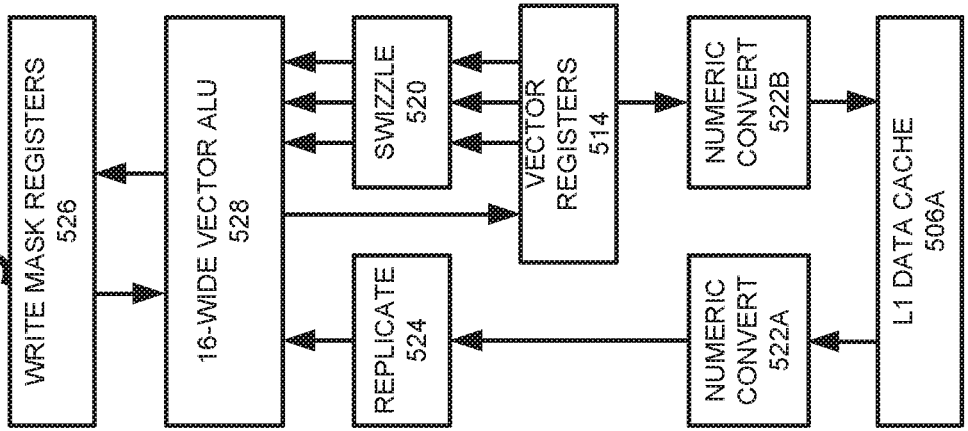
FIGS. 5a-5b illustrate a block diagram of a more specific in-order core architecture, which core would be one of several logic blocks (including other cores of the same type and/or different types) in a chip according to one or more examples of the present specification.
Figure 5A:
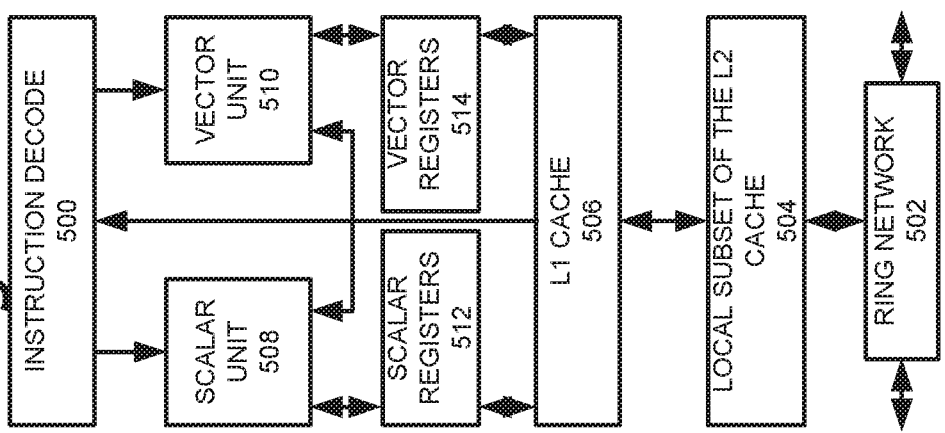

FIGS. 5*a*-5*b* illustrate a block diagram of a more specific example in-order core architecture, which core would be one of several logic blocks (including other cores of the same type and/or different types) in a chip. The logic blocks communicate through a high-bandwidth interconnect network (e.g., a ring network) with some fixed function logic, memory IO interfaces, and other necessary IO logic, depending on the application.

FIG. 5*a* is a block diagram of a single processor core, along with its connection to the on-die interconnect network 502 and with its local subset of the Level 2 (L2) cache 504, according to one or more embodiments. In one embodiment, an instruction decoder 500 supports the x86 instruction set with a packed data instruction set extension. An L1 cache 506 allows low-latency accesses to cache memory into the scalar and vector units. While in one embodiment (to simplify the design), a scalar unit 508 and a vector unit 510 use separate register sets (respectively, scalar registers 512 and vector registers 514) and data transferred between them is written to memory and then read back in from a level 1 (L1) cache 506, other embodiments may use a different approach (e.g., use a single register set or include a communication path that allows data to be transferred between the two register files without being written and read back).

The local subset of the L2 cache 504 is part of a global L2 cache that is divided into separate local subsets, one per processor core. Each processor core has a direct access path to its own local subset of the L2 cache 504. Data read by a processor core is stored in its L2 cache subset 504 and can be accessed quickly, in parallel with other processor cores accessing their own local L2 cache subsets. Data written by a processor core is stored in its own L2 cache subset 504 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 5b is an expanded view of part of the processor core in FIG. 5a according to embodiments of the specification. FIG. 5b includes an L1 data cache 506A, part of the L1 cache 504, as well as more detail regarding the vector unit 510 and the vector registers 514. Specifically, the vector unit 510 is a 16-wide vector processing unit (VPU) (see the 16-wide ALU 528), which executes one or more of integer, single-precision float, and double-precision float instructions. The VPU supports swizzling the register inputs with swizzle unit 520, numeric conversion with numeric convert units 522A-B, and replication with replication unit 524 on the memory input. Write mask registers 526 allow predicating resulting vector writes.

Figure 6:
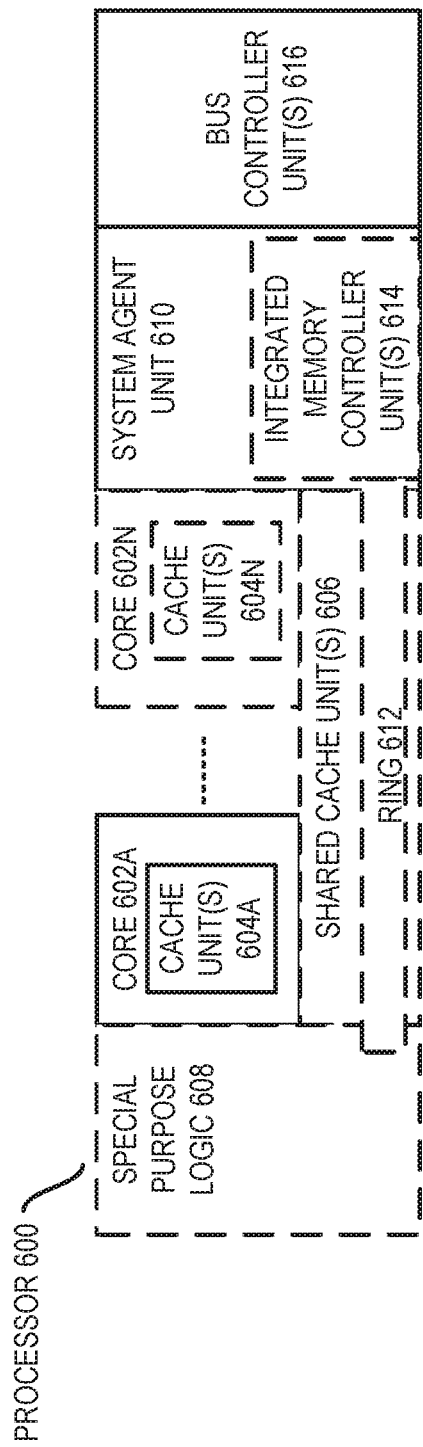
FIG. 6 is a block diagram of a processor that may have more than one core, may have an integrated memory controller, and may have integrated graphics according to one or more examples of the present specification.

FIG. 6 is a block diagram of a processor 600 that may have more than one core, may have an integrated memory controller, and may have integrated graphics according to embodiments of the specification. The solid lined boxes in FIG. 6 illustrate a processor 600 with a single core 602A, a system agent 610, a set of one or more bus controller units 616, while the optional addition of the dashed lined boxes illustrates an alternative processor 600 with multiple cores 602A-N, a set of one or more integrated memory controller unit(s) 614 in the system agent unit 610, and special purpose logic 608.

Thus, different implementations of the processor 600 may include: 1) a CPU with the special purpose logic 608 being integrated graphics and/or scientific (throughput) logic (which may include one or more cores), and the cores 602A-N being one or more general purpose cores (e.g., general purpose in-order cores, general purpose out-of-order cores, a combination of the two); 2) a coprocessor with the cores 602A-N being a large number of special purpose cores intended primarily for graphics and/or scientific throughput; and 3) a coprocessor with the cores 602A-N being a large number of general purpose in-order cores. Thus, the processor 600 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 600 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 606, and external memory (not shown) coupled to the set of integrated memory controller units 614. The set of shared cache units 606 may include one or more mid-level caches, such as level 2 (L2), level 3 (L3), level 4 (L4), or other levels of cache, a last level cache (LLC), and/or combinations thereof. While in one embodiment a ring based interconnect unit 612 interconnects the integrated graphics logic 608, the set of shared cache units 606, and the system agent unit 610/integrated memory controller unit(s) 614, alternative embodiments may use any number of well-known techniques for interconnecting such units. In one embodiment, coherency is maintained between one or more cache units 606 and cores 602A-N.

In some embodiments, one or more of the cores 602A-N are capable of multi-threading. The system agent 610 includes those components coordinating and operating cores 602A-N. The system agent unit 610 may include, for example, a power control unit (PCU) and a display unit. The PCU may be or include logic and components needed for regulating the power state of the cores 602A-N and the integrated graphics logic 608. The display unit is for driving one or more externally connected displays.

The cores 602A-N may be homogenous or heterogeneous in terms of architecture instruction set; that is, two or more of the cores 602A-N may be capable of executing the same instruction set, while others may be capable of executing only a subset of that instruction set or a different instruction set.

Example Computer Architectures

FIGS. 7-10 are block diagrams of example computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 7:
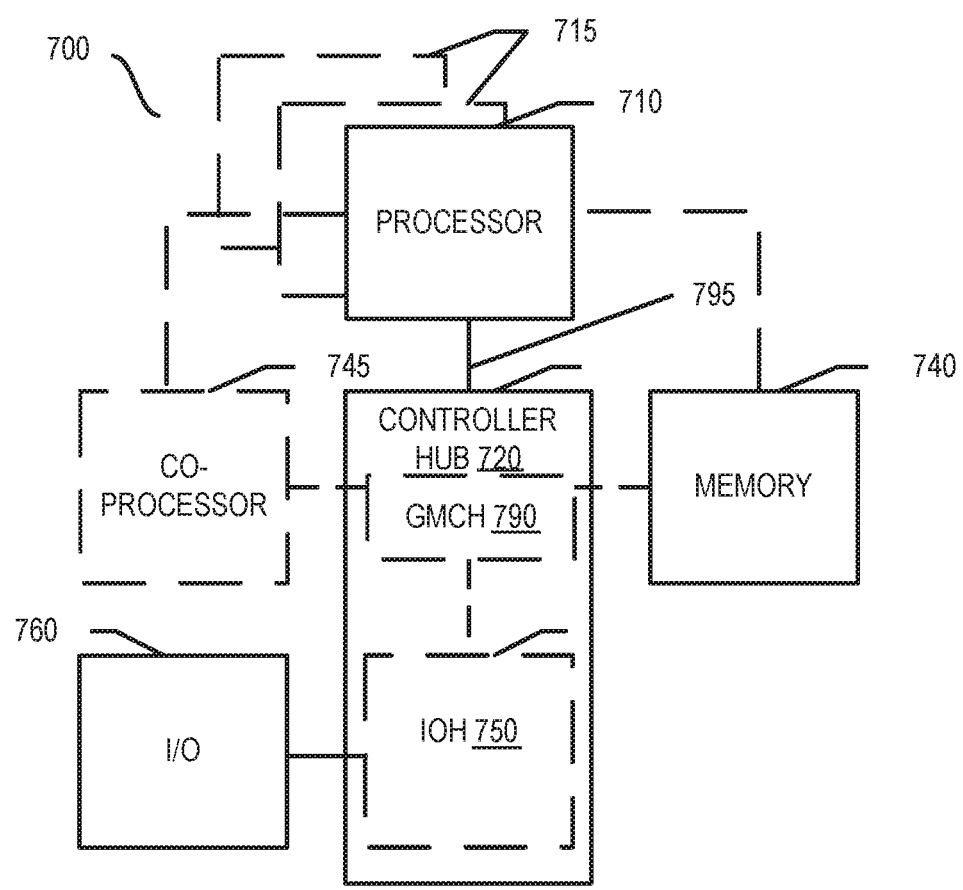
FIGS. 7-10 are block diagrams of computer architectures according to one or more examples of the present specification.

Referring now to FIG. 7, shown is a block diagram of a system 700 in accordance with one embodiment. The system 700 may include one or more processors 710, 715, which are coupled to a controller hub 720. In one embodiment the controller hub 720 includes a graphics memory controller hub (GMCH) 790 and an Input/Output Hub (IOH) 750 (which may be on separate chips); the GMCH 790 includes memory and graphics controllers to which are coupled memory 740 and a coprocessor 745; the IOH 750 couples input/output (IO) devices 760 to the GMCH 790. Alternatively, one or both of the memory and graphics controllers are integrated within the processor (as described herein), the memory 740 and the coprocessor 745 are coupled directly to the processor 710, and the controller hub 720 in a single chip with the IOH 750.

The optional nature of additional processors 715 is denoted in FIG. 7 with broken lines. Each processor 710, 715 may include one or more of the processing cores described herein and may be some version of the processor 600.

The memory 740 may be, for example, dynamic random access memory (DRAM), phase change memory (PCM), or a combination of the two. For at least one embodiment, the controller hub 720 communicates with the processor(s) 710, 715 via a multidrop bus, such as a frontside bus (FSB), point-to-point interface such as Ultra Path Interconnect (UPI), or similar connection 795.

In one embodiment, the coprocessor 745 is a special-purpose processor, such as, for example, a high-throughput MIC processor, a network or communication processor, compression engine, graphics processor, GPGPU, embedded processor, or the like. In one embodiment, controller hub 720 may include an integrated graphics accelerator.

There can be a variety of differences between the physical resources 710, 715 in terms of a spectrum of metrics of merit including architectural, microarchitectural, thermal, power consumption characteristics, and the like.

In one embodiment, the processor 710 executes instructions that control data processing operations of a general type. Embedded within the instructions may be coprocessor instructions. The processor 710 recognizes these coprocessor instructions as being of a type that should be executed by the attached coprocessor 745. Accordingly, the processor 710 issues these coprocessor instructions (or control signals representing coprocessor instructions) on a coprocessor bus or other interconnect, to coprocessor 745. Coprocessor(s) 745 accepts and executes the received coprocessor instructions.

Figure 8:
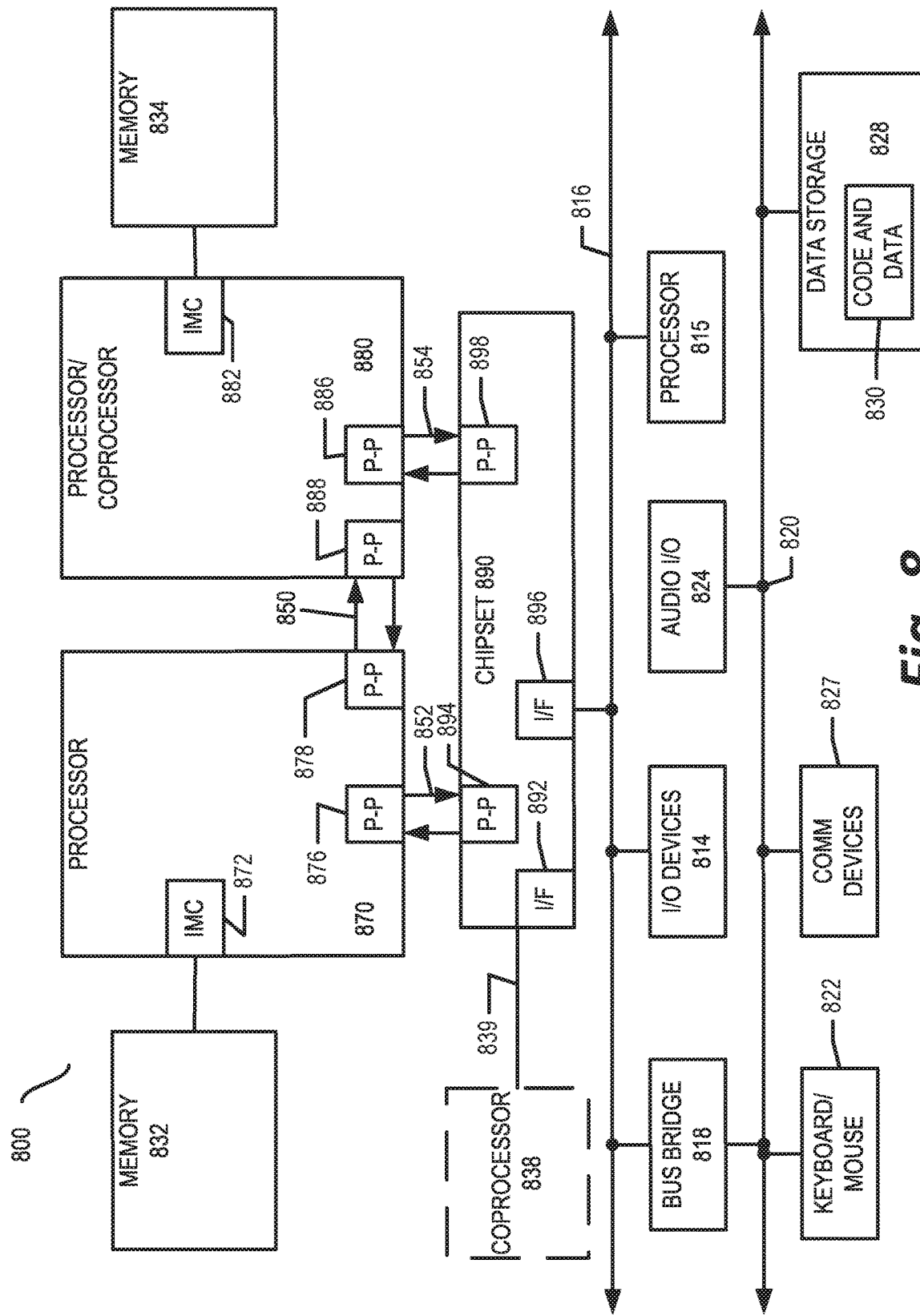

Referring now to FIG. 8, shown is a block diagram of a first more specific example system 800. As shown in FIG. 8, multiprocessor system 800 is a point-to-point interconnect system, and includes a first processor 870 and a second processor 880 coupled via a point-to-point interconnect 850. Each of processors 870 and 880 may be some version of the processor 600. In one embodiment, processors 870 and 880 are respectively processors 710 and 715, while coprocessor 838 is coprocessor 745. In another embodiment, processors 870 and 880 are respectively processor 710 coprocessor 745.

Processors 870 and 880 are shown including integrated memory controller (IMC) units 872 and 882, respectively. Processor 870 also includes as part of its bus controller units point-to-point (P-P) interfaces 876 and 878; similarly, second processor 880 includes P-P interfaces 886 and 888. Processors 870, 880 may exchange information via a point-to-point (P-P) interface 850 using P-P interface circuits 878, 888. As shown in FIG. 8, IMCs 872 and 882 couple the processors to respective memories, namely a memory 832 and a memory 834, which may be portions of main memory locally attached to the respective processors.

Processors 870, 880 may each exchange information with a chipset 890 via individual P-P interfaces 852, 854 using point to point interface circuits 876, 894, 886, 898. Chipset 890 may optionally exchange information with the coprocessor 838 via a high-performance interface 839. In one embodiment, the coprocessor 838 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 890 may be coupled to a first bus 816 via an interface 896. In one embodiment, first bus 816 may be a peripheral component interconnect (PCI) bus, or a bus such as a PCI Express bus or another third generation IO interconnect bus, by way of nonlimiting example.

As shown in FIG. 8, various IO devices 814 may be coupled to first bus 816, along with a bus bridge 818 which couples first bus 816 to a second bus 820. In one embodiment, one or more additional processor(s) 815, such as coprocessors, high-throughput MIC processors, GPGPUs, accelerators (such as, e.g., graphics accelerators or digital signal processing (DSP) units), field programmable gate arrays, or any other processor, are coupled to first bus 816. In one embodiment, second bus 820 may be a low pin count (LPC) bus. Various devices may be coupled to a second bus 820 including, for example, a keyboard and/or mouse 822, communication devices 827 and a storage unit 828 such as a disk drive or other mass storage device which may include instructions or code and data 830, in one embodiment. Further, an audio IO 824 may be coupled to the second bus 820. Note that other architectures are possible. For example, instead of the point-to-point architecture of FIG. 8, a system may implement a multidrop bus or other such architecture.

Figure 9:
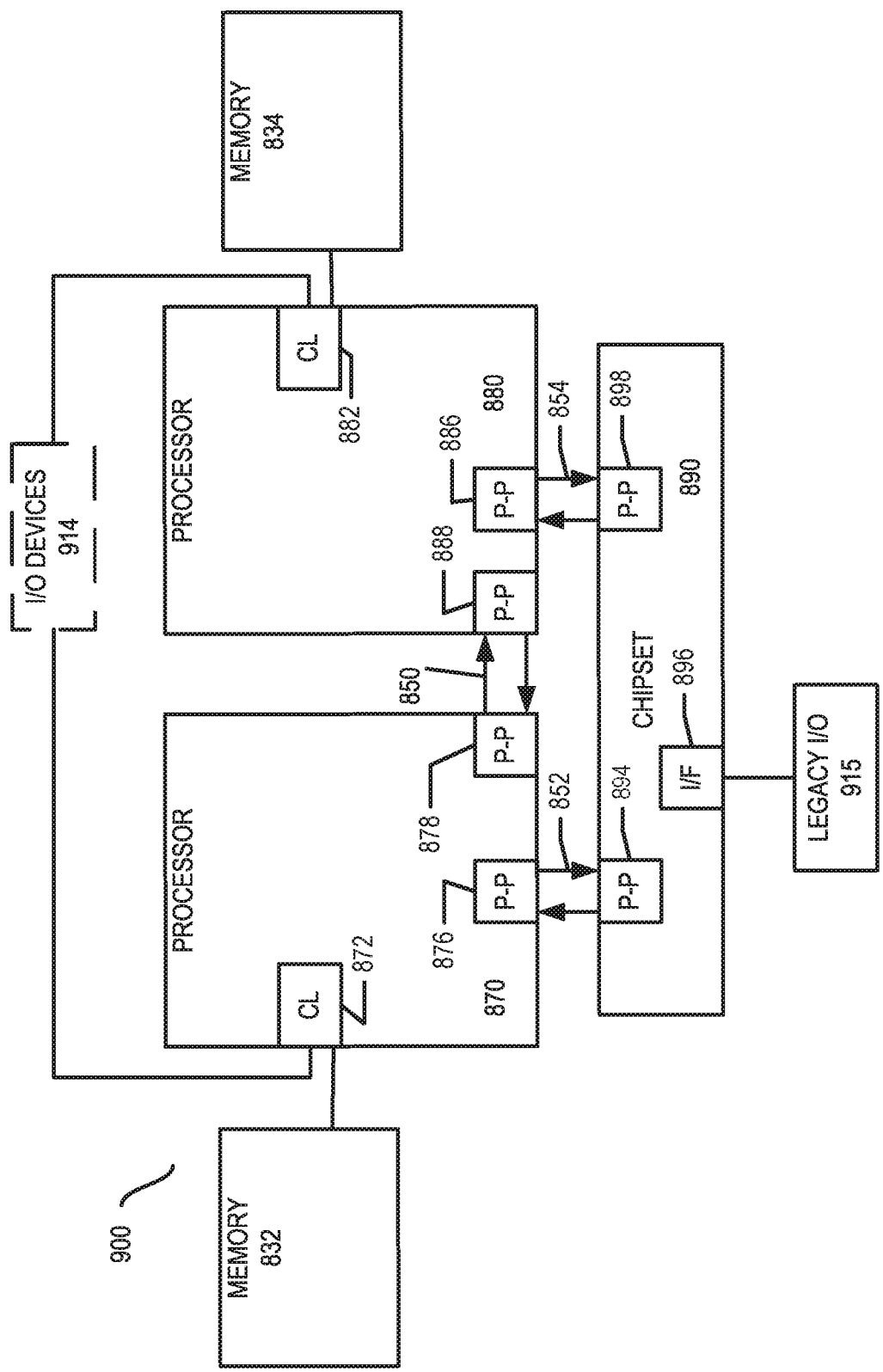

Referring now to FIG. 9, shown is a block diagram of a second more specific example system 900. FIGS. 8 and 9 bear like reference numerals, and certain aspects of FIG. 8 have been omitted from FIG. 9 in order to avoid obscuring other aspects of FIG. 9.

FIG. 9 illustrates that the processors 870, 880 may include integrated memory and IO control logic ("CL") 872 and 882, respectively. Thus, the CL 872, 882 include integrated memory controller units and include IO control logic. FIG. 9 illustrates that not only are the memories 832, 834 coupled to the CL 872, 882, but also that IO devices 914 are also coupled to the control logic 872, 882. Legacy IO devices 915 are coupled to the chipset 890.

Figure 10:
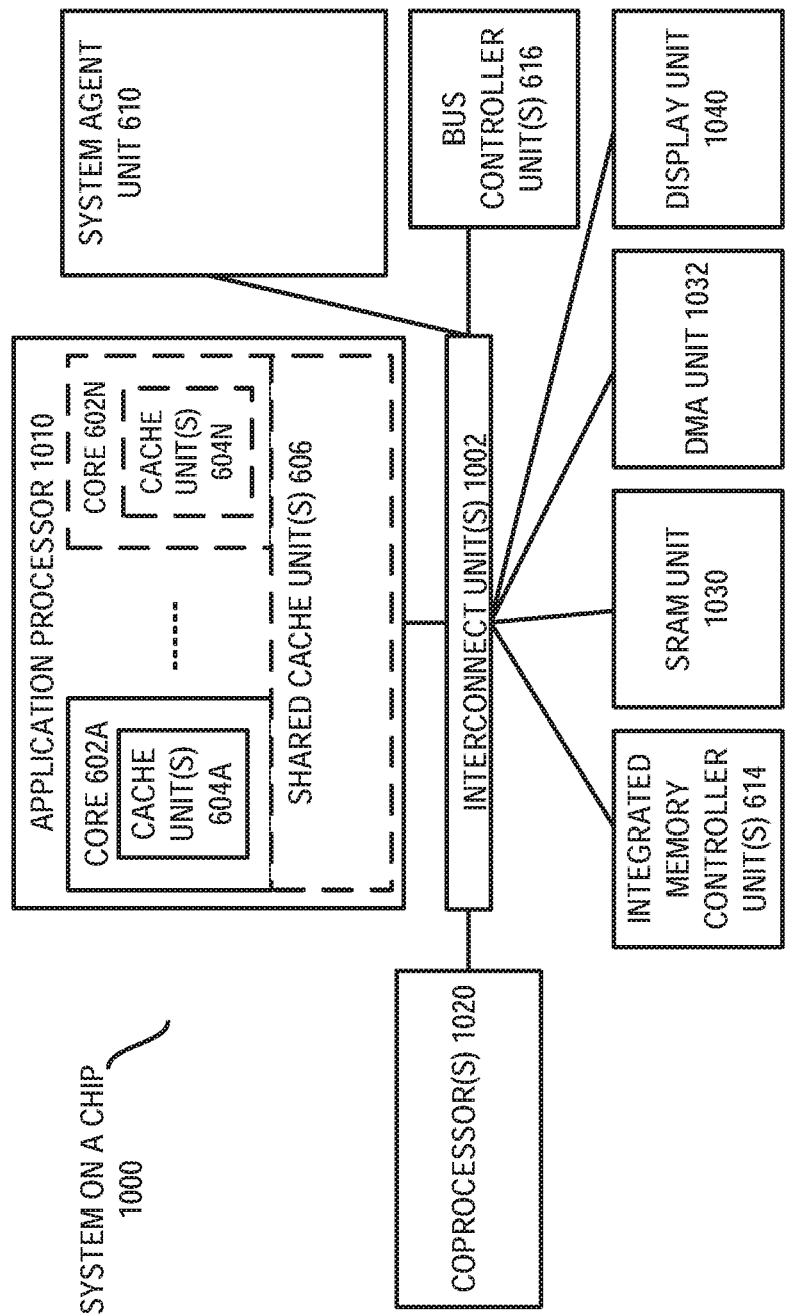

Referring now to FIG. 10, shown is a block diagram of a SoC 1000 in accordance with an embodiment. Similar elements in FIG. 6 bear like reference numerals. Also, dashed lined boxes are optional features on more advanced SoCs. In FIG. 10, an interconnect unit(s) 1002 is coupled to: an application processor 1010 which includes a set of one or more cores 202A-N and shared cache unit(s) 606; a system agent unit 610; a bus controller unit(s) 616; an integrated memory controller unit(s) 614; a set of one or more coprocessors 1020 which may include integrated graphics logic, an image processor, an audio processor, and a video processor; a static random access memory (SRAM) unit 1030; a direct memory access (DMA) unit 1032; and a display unit 1040 for coupling to one or more external displays. In one embodiment, the coprocessor(s) 1020 includes a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Some embodiments may be implemented as computer programs or program code executing on programmable systems comprising at least one processor, a storage system (including volatile and nonvolatile memory and/or storage elements), at least one input device, and at least one output device.

Program code, such as code 830 illustrated in FIG. 8, may be applied to input instructions to perform the functions described herein and generate output information. The output information may be applied to one or more output devices, in known fashion. For purposes of this application, a processing system includes any system that has a processor, such as, for example, a digital signal processor (DSP), a microcontroller, an application-specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, nontransitory, tangible arrangements of articles manufactured or formed by a machine or device, including storage media such as hard disks, any other type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, some embodiments also include nontransitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation or dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 11:
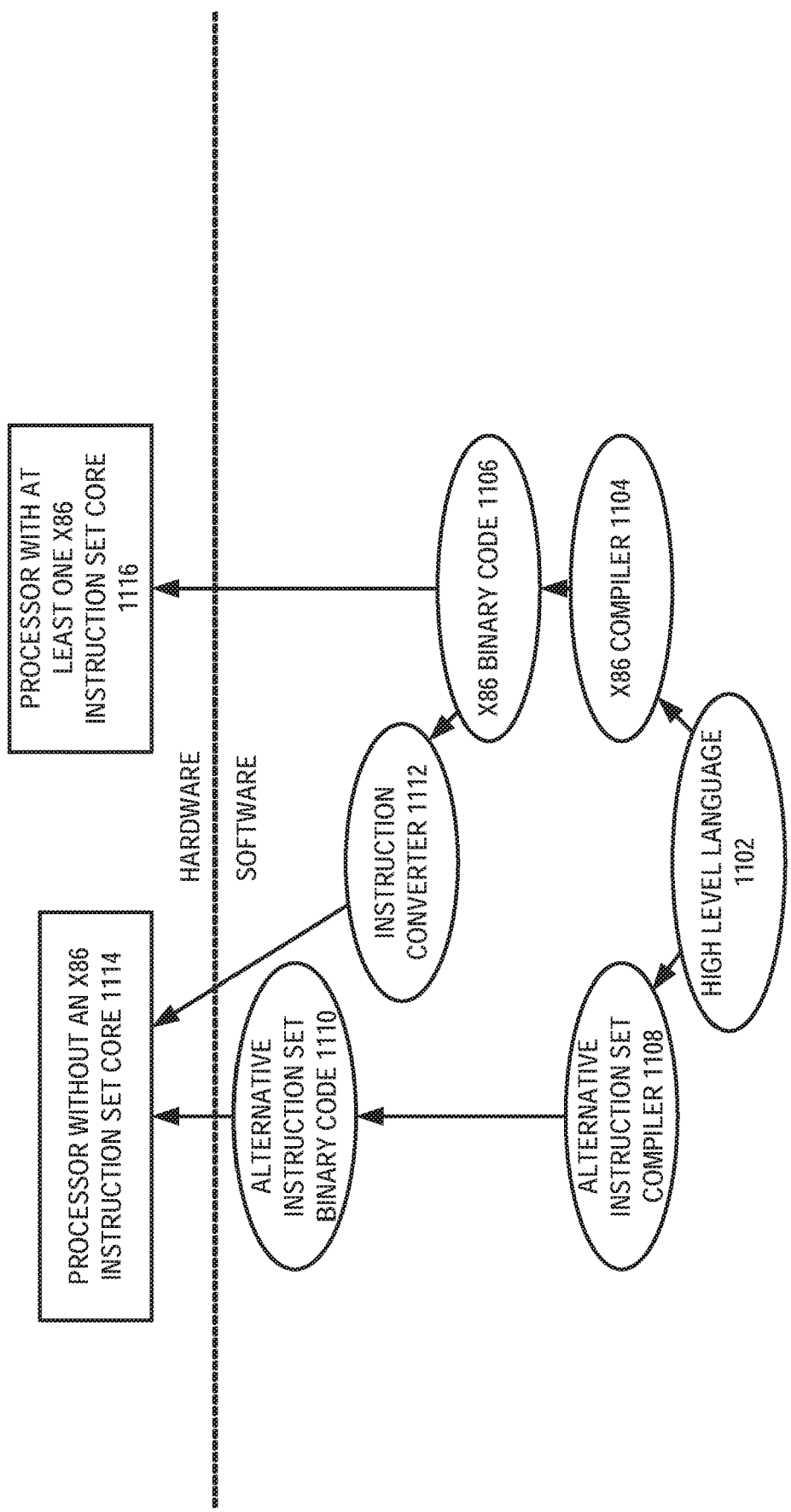
FIG. 11 is a block diagram contrasting the use of a software instruction converter to convert binary instructions in a source instruction set to binary instructions in a target instruction set according to one or more examples of the present specification.

FIG. 11 is a block diagram contrasting the use of a software instruction converter to convert binary instructions in a source instruction set to binary instructions in a target instruction set. In the illustrated embodiment, the instruction converter is a software instruction converter, although alternatively the instruction converter may be implemented in software, firmware, hardware, or various combinations thereof. FIG. 11 shows a program in a high level language 1102 may be compiled using an x86 compiler 1104 to generate x86 binary code 1106 that may be natively executed by a processor with at least one x86 instruction set core 1116. The processor with at least one x86 instruction set core 1116 represents any processor that can perform substantially the same functions as an Intel® processor with at least one x86 instruction set core by compatibly executing or otherwise processing (1) a substantial portion of the instruction set of the Intel® x86 instruction set core or (2) object code versions of applications or other software targeted to run on an Intel® processor with at least one x86 instruction set core, in order to achieve substantially the same result as an Intel® processor with at least one x86 instruction set core. The x86 compiler 1104 represents a compiler that is operable to generate x86 binary code 1106 (e.g., object code) that can, with or without additional linkage processing, be executed on the processor with at least one x86 instruction set core 1116. Similarly, FIG. 11 shows the program in the high level language 1102 may be compiled using an alternative instruction set compiler 1108 to generate alternative instruction set binary code 1110 that may be natively executed by a processor without at least one x86 instruction set core 1114 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1112 is used to convert the x86 binary code 1106 into code that may be natively executed by the processor without an x86 instruction set core 1114. This converted code is not likely to be the same as the alternative instruction set binary code 1110 because an instruction converter capable of this is difficult to make; however, the converted code will accomplish the general operation and be made up of instructions from the alternative instruction set. Thus, the instruction converter 1112 represents software, firmware, hardware, or a combination thereof that, through emulation, simulation or any other process, allows a processor or other electronic device that does not have an x86 instruction set processor or core to execute the x86 binary code 1106.

Figure 12:
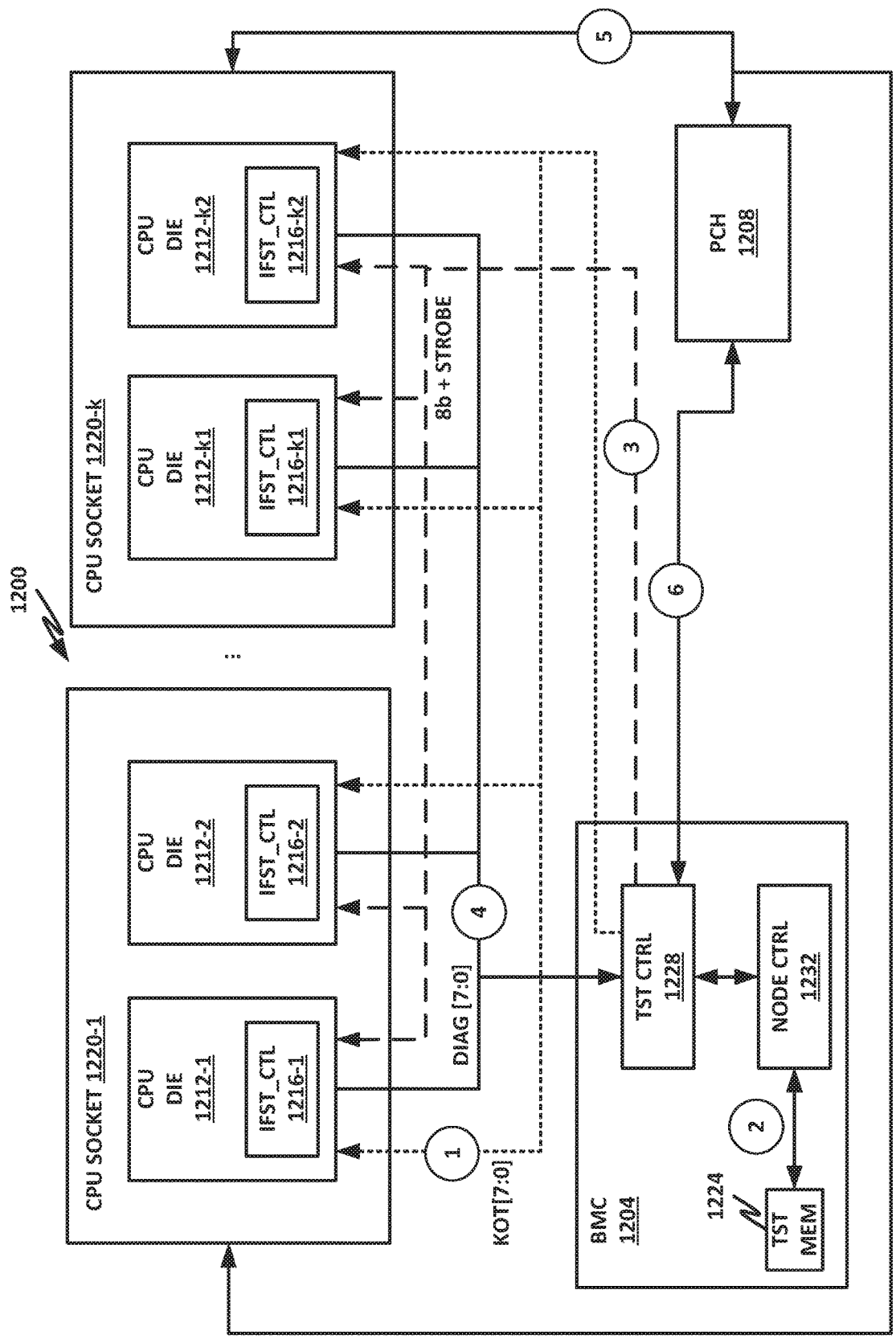
FIG. 12 is a block diagram of a test system according to one or more examples of the present specification.

FIG. 12 is a block diagram of a test system 1200, according to one or more examples of the present specification. Test system 1200 is configured to accommodate a plurality of CPU dies 1212 located on a plurality of CPU sockets 1220. In this example, each CPU socket 1220 supports up to two CPU dies 1212. This is, however, a nonlimiting example, and in a general sense, any socket and die configuration may be used.

In this example, CPU socket 1220-1 in CPU socket 1220-K represent a plurality of two core sockets. The designation of CPU socket 1220-K indicates that in fact any suitable number of sockets may be used in test system 1200. In a general sense, the selection of a number of sockets for testing may depend on design considerations such as space and power constraints, cost, and other engineering factors.

CPU socket 1220-1 includes CPU die 1212-1 and CPU die 1212-2. Note that in this example, CPUs 1212 are shown directly in CPU socket 1220. Note, however, that in some embodiments, CPU socket 1220 may itself be part of a larger integrated system, such as a system-on-a-chip (SoC). Thus, CPU socket 1220-1 should not be understood to be limited to a so-called plug-in socket where CPU die 1212 can be modularly plugged into the socket. Rather, CPU socket 1220 is intended to represent in a general sense the support circuitry and functions that operate with CPU dies 1212.

In this illustration, four CPU dies 1212 are shown, namely CPU die 1212-1 and CPU die 1212-2, on CPU socket 1220-1, and on CPU socket 1220-K, CPU die 1212-K1 and CPU die 1212-K2. In this example, each CPU die 1212 includes a respecter IFST control block 1216. IFST control block 1216 includes the circuitry and logic for carrying out the IFST functions described herein.

Also visible in this figure are a baseline management controller (BMC) 1204 and a platform control host (PCH) 1208. BMC 1204 may be configured to carry out the IFST methods disclosed herein, while PCH 1208 may enable BMC 1204 under appropriate circumstances to access a register such as an ISR containing test results via a PECI interface.

BMC 1204 includes a test controller 1228, a node controller 1232, and a test memory 1224. In some examples, node controller 1232 may include the logic for providing baseline BMC functionality. Test controller 1228 may be an FPGA, integrated circuit, software, firmware, or other logic for performing the testing functions described herein. Test memory 1224 may be a volatile or nonvolatile memory, including for example a flash memory, a static RAM, 3-D Crosspoint™ memory, or other memory for storing test patterns.

In an example, an operator of BMC 1204 does not provide its own test patterns and test memory 1224. Rather, those test patterns may be provided by a manufacturer of CPU socket 1220 and/or CPU die 1212 in a signed and encrypted format, thus ensuring that IP and security of CPU dies 1212 are not compromised.

By way of an example signal flow illustrated in FIG. 12, a higher level of the system manager may ask a compute board's BMC 1204 to run IFST on a plurality of that board's CPU dies. For example, the board may include 8 CPU dies, and the test may be run on between 1 and 8 of those dies.

At operation one, BMC 1204 asserts the KOT bus or pin to enable the dies to run IFST tests as part of their diagnostics. Note that in this example, an 8-bit wide KOT bus or pin is used to illustrate that up to eight processors may be supported in this example, with each IFST controller 1216 controlling one line of the KOT bus or pin. BMC 1204 may then issue via PCH 1208 a cold reset to CPU dies 1212, which in some embodiments is required to run IFST tests.

During its power up cycle, each CPU die 1212 may sample the KOT bus or pin, and based on the presence of the KOT signal, may boot into a special IFST mode. Note that in some embodiments, de-assertion of the KOT pin or bus may automatically trigger a cold reboot. Thus, in those embodiments, KOT may need to be maintained during the entire pendency of the test sequence. Also note that in some embodiments, multiple test sequences may be run, requiring multiple cold reboots into IFST mode, in which different test sequences can be run on each reboot.

Also note that in embodiments where an IFST fuse is used, the KOT bus or pin may be ignored unless the IFST enabled fuse has also been set.

Upon determining that the KOT signal is present, and optionally, that an IFST enabled fuse is set, a p-unit within CPU die 1212 executes through its reset sequence until it reaches a designated phase, such as phase 5. At this point, rather than enabling interfaces, CPU die 1212 isolates all external interfaces. These may include, by way of nonlimiting example, a general-purpose input/output (GPIO), a test access point (TAP), PECI, peripheral component interconnect express (PCIe), memory, and desktop management interface (DMI). This also includes unlocking the DFX network before handing off control to the IFST hardware, executes an unlock command that exposes the TAP functionality, and issues a start request to IFST controller 1216-1.

When IFST 1216 has completed its reset process, then IFST controller 1216 asserts the diag bus or pin out to test controller 1228. When test controller 1228 determines that all CPU dies 1212 have asserted their diag buses or pins, then in operation 2, test controller 1228 communicates with node controller 1232 to fetch from test memory 1224 the first test sequence.

Once test controller 1228 has received the first test sequence, it operates a dedicated strobe bus, which may include an 8-bit bus plus a strobe signal. Test controller 1228 uses the strobe bus to strobe the test sequence out to each selected CPU die 1212. Note that not all CPU dies 1212 need be tested. Rather, any of the desired CPU dies 1212 may be tested by asserting their respective KOT pins or buses during the cold reset sequence.

Once the CPU dies 1212 under test capture the strobed test sequence, they may authenticate the test sequence, such as by checking its signature and verifying hashes. If the test sequence is authenticated, then IFST controller 1216 runs the authenticated sequence. If the sequence is not authenticated, then IFST controller 1216 may in some embodiments set an error flag in the ISR to indicate that the test sequence failed. However, even a failure of an individual test sequence need not necessarily terminate the entire test.

Rather, additional test sequences can be sent, and if they are authenticated, they may be run.

While IFST controllers 1216 are running the test sequence, they maintain the diag bus or pin in its asserted state. The diag bus or pin thus acts as an indicator that a particular IFST controller 1216 is still busy. Note that in this example, an 8-bit wide diag bus is used to illustrate that up to eight processors may be supported in this example, with each IFST controller 1216 controlling one line of the diag bus.

Once a CPU die 1212 completes its present test sequence, it de-asserts its respective diag pin and waits.

When test controller 1228 determines that all CPU dies 1212 under test have de-asserted their respective diag pins, it is prepared to send out more test data as necessary. Thus, operations 2, 3, and 4 may be repeated until the full test battery has been completed.

As test sequences are completed, CPU sockets 1220 at operation 5 report test results to PCH 1208, where the results of each test may be stored in a register such as an ISR.

When all IFST test sequences are done (for example, the test sequence size field in test memory 1224 is set to 0X00000000), then in operation 6, BMC 1204 is ready to read out the results. Operating the PECI interface, BMC 1204 queries PCH 1208 for the contents of the ISR, and may store the results as appropriate.

BMC 1204 may now de-assert the KOT pins for each CPU die 1212 under test. This may cause a cold reboot of those CPU dies 1212. In some embodiments, or in addition, BMC 1204 may also issue an explicit cold restart signal via PCH 1208. Note that in some examples, the KOT signal is connected to the internal variable length decoder (VLD), so that de-assertion of the KOT may automatically require a power cycling cold reset. Thus, in such embodiments, the KOT signal should not be de-asserted until the final power cycling reset is to be performed.

Finally, BMC 1204 may report, such as based on the CPU dies 1212, ISR register values and its IFST test results to a higher level system manager.

Figure 13:
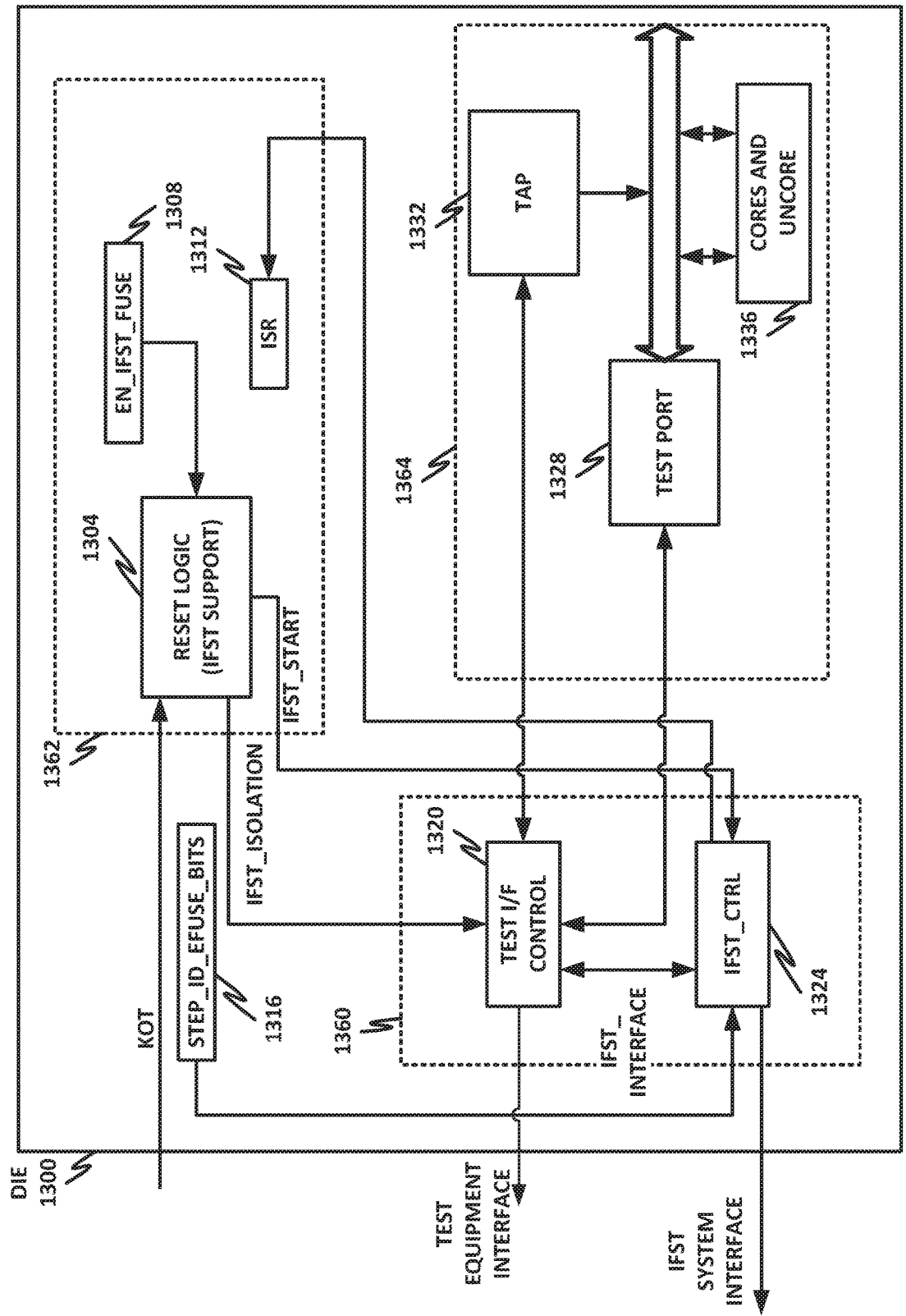
FIG. 13 is a block diagram of selected elements of a die according to one or more examples of the present specification.

FIG. 13 is a block diagram of selected elements of a die 1300 according to one or more examples of the present specification. In particular, the example of FIG. 13 illustrates selected elements related to the IFST method of the present specification.

For convenience, portions of the diagram are grouped in the FIGURES as a control block 1360, a test block 1364, and a reset logic block 1362. These groupings should not be understood to necessarily imply or require that these blocks be provided in separate hardware component or in discrete units, but rather are illustrated here to clarify at a high level some of the different functions that may be performed in connection with an IFST.

Reset block 1362 includes components that are useful during the reset process. In particular, reset logic 1304 includes IFST support. This means that reset logic 1304 may be configured to sample the KOT input upon the occurrence of a cold reset or power cycle. Reset logic 1304 may also sample a fuse labeled "enable IFST fuse" 1308. Enable IFST fuse 1308 may be set to control whether IFST is available as a feature on die 1300 or not. Reset logic block 1362 also includes ISR 1312 in this example, to illustrate that ISR 1312 is tied to the reset functionality. Specifically, when die 1300 is reset, ISR 1312 may be cleared to ensure that the values of ISR 1312 are not exposed outside of their proper or authorized context.

Upon the occurrence of a reset, reset logic 1304 samples KOT input, and determines based on KOT input and enable IFST fuse 1308 that die 1300 is to start in IFST mode. Reset logic 1304 therefore asserts an IFST isolation signal and an IFST start signal. Both of these signals are received by control block 1360.

Within control block 1360, there is a test interface control 1320 and IFST control 1324. Test interface control 1320 receives the IFST isolation signal, and responsive to this signal opens only those ports required to provide a test equipment interface. These may include, for example, the diag and strobe buses of FIG. 12.

The strobe bus is, in one example, a dedicated data bus between the onboard management controller and the CPU die. Because the IFST is under the control of a third-party, the contents are not treated as trusted from the perspective of a CPU die 1212. Thus, data coming from the data bus to the IFST controller may be stored in a buffer until it is decrypted and successfully authenticated. If authentication or decryption fails, the packet is dropped and not executed. This ensures that an attacker is not able to run any malicious content using the IFST architecture, through the data bus, pins, or any other means, with an intent to damage the chip or gain privileged control. The encryption ensures that an attacker cannot reverse engineer the content of the IFST test sequences and thus expose proprietary IP or other information.

All other inputs and outputs onto die 1300 may be disabled to ensure that no tampering occurs during the test.

IFST controller 1324 receives test sequences via test equipment interface, and may decode and authenticate the test sequences. If authentication fails, then IFST controller 1324 may, for example, a search an error flag within ISR 1312. If authentication is successful, then IFST controller 1324 may begin receiving test sequences.

Once the test sequence is authenticated and authorized, and the test sequence is to begin, test interface control 1320 enables TAP block 1332. TAP block 1332 enables access to testing functionality, including in some examples all available HVM tests and infrastructure within the processor.

Cores and uncore 1336 interface with test ports 1328 to perform the required tasks according to the test sequence. As test results are completed, they may be reported to IFST control block 1324, and IFST controller 1324 may write the appropriate test results to ISR 1312. These test results may include, by way of nonlimiting example, flags indicating test success or failure, integer values representing test results (such as a bandwidth measurement or a throughput measurement).

Once a battery of tests is complete, the BMC may read values from ISR 1312 via the test equipment interface, and once the values are read, the KOT signal may be de-asserted. In certain embodiments, de-assertion of the KOT will automatically cause a reset of die 1300. Additionally, or in other embodiments, an explicit reset may occur.

In an example, IFST tests are run upon a cold power cycling reset, and only when demanded by the system via assertion of the kick-off test (KOT) bus, which in some embodiments is a novel pin or bus provided to initiate an IFST. In other examples, an IFST-enabling fuse could be used to allow IFST to run only in certain models or specific processors. As with the HVM test suite, the IFST test suite may include a number of test sequences separated by cold resets.

By way of example, all resets issued while the KOT input is asserted may be required to support IFST to achieve correct security and behavior. In one or more embodiments, functions in support of IFST performed by the reset logic include, by way of nonlimiting example:

Sample KOT pin and IFST enabling fuse to determine if IFST is enabled. This may be performed in one example by a p-code.

Isolate test and external I/O interfaces for security reasons. For example, a p-code may assert IFST isolation.

Unlock the TAP and kickoff IFST controller to start the test sequence. A p-code may assert IFST start. Unlocking the TAP enables access to all HVM test infrastructure functions within the core.

Once a p-code asserts the IFST start, it halts itself and waits in the halted state until awakened by the next cold reset.

Upon the occurrence of a reset, reset logic 1304 samples KOT input, and determines based on KOT input and enable IFST fuse 1308 that die 1300 is to start in IFST mode. Reset logic 1304 therefore asserts an IFST isolation signal and an IFST start signal. Both of these signals are received by control block 1360.

Within control block 1360, there is a test interface control 1320 and IFST control 1324. Test interface control 1320 receives the IFST isolation signal, and responsive to this signal opens only those ports required to provide a test equipment interface. These may include, for example, the diag and strobe buses of FIG. 12. All other inputs and outputs onto die 1300 may be disabled to ensure that no tampering occurs during the test.

IFST controller 1324 receives test sequences via test equipment interface, and may decode and authenticate the test sequences. If authentication fails, then IFST controller 1324 may, for example, a search an error flag within ISR 1312. If authentication is successful, then IFST controller 1324 may begin receiving test sequences.

Once the test sequence is authenticated and authorized, and the test sequence is to begin, test interface control 1320 enables TAP block 1332. TAP block 1332 enables access to testing functionality, including in some examples all available HVM tests and infrastructure within the processor.

Cores and uncore 1336 interface with test ports 1328 to perform the required tasks according to the test sequence. As test results are completed, they may be reported to IFST control block 1324, and IFST controller 1324 may write the appropriate test results to ISR 1312. These test results may include, by way of nonlimiting example, flags indicating test success or failure, integer values representing test results (such as a bandwidth measurement or a throughput measurement).

Once a battery of tests is complete, the BMC may read values from ISR 1312 via the test equipment interface, and once the values are read, the KOT signal may be de-asserted. In certain embodiments, de-assertion of the KOT will automatically cause a reset of die 1300. Additionally, or in other embodiments, an explicit reset may occur.

Figure 14:
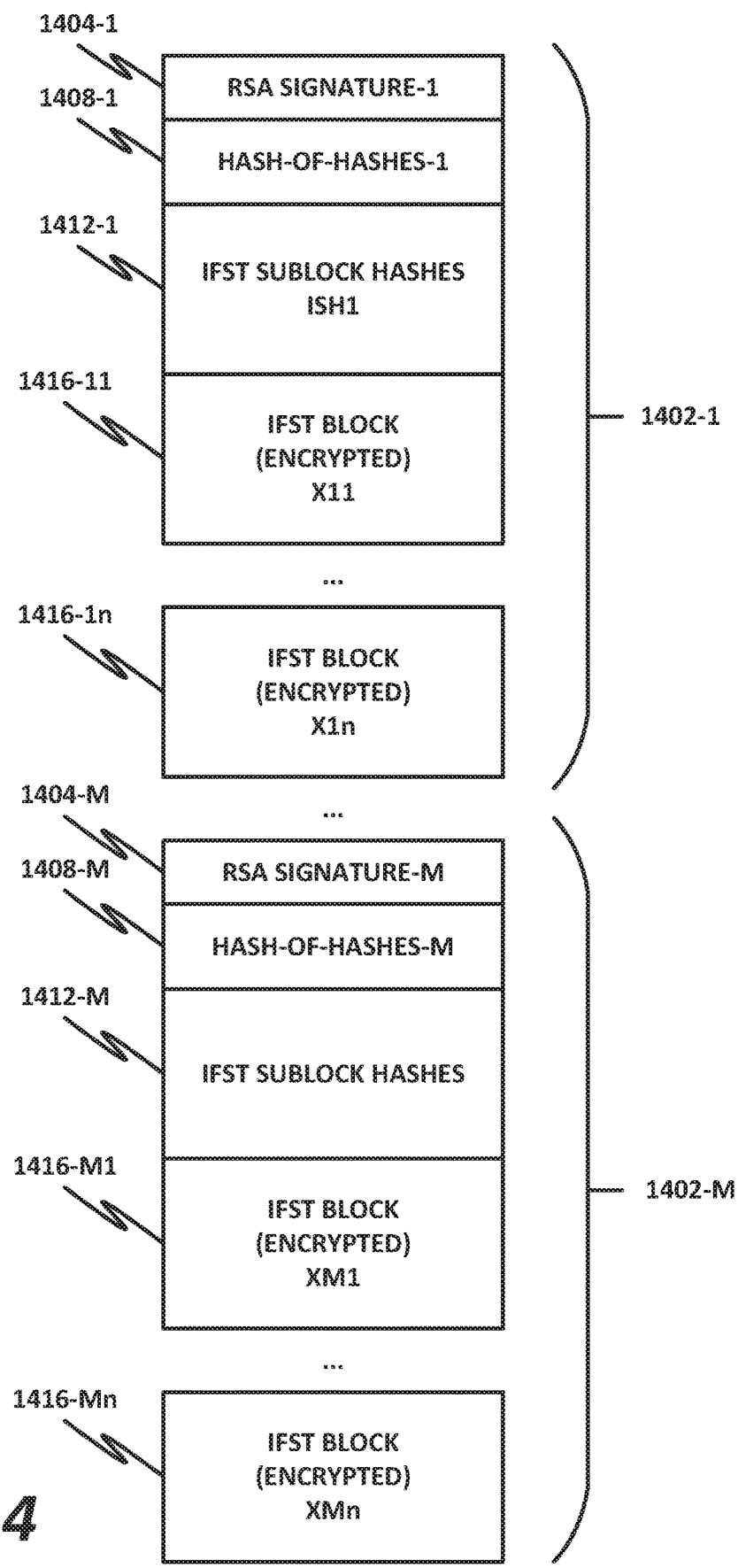
FIG. 14 is a block diagram of an in-field system test (IFST) vector sequence according to one or more examples of the present specification.

FIG. 14 is a block diagram of an IFST test vector sequence according to one or more examples of the present specification. Note that in many cases, the test vectors may be very large, in some cases exceeding 4 GB. Thus, it may be infeasible to sign and store all test vectors in the limited on-die memory at once. In light of the memory constraints, embodiments of the present specification include a scheme where a test vector is divided into M block groups. In this example, each block group contains a unique RSA signature 1404, IFST sub block hashes 1412, and encrypted blocks 1416. Each block group is self-contained and therefore allows reusability and portability from project to project.

In this embodiment, a block group of M blocks is illustrated. These are labeled as block groups 1402-1 through 1402-M.

Block group 1402-1 includes encrypted IFST blocks 1416-11 through 1416-1N. Block 1412-1 includes the individual hashes for each encrypted block 1416. Block 1408-1 includes a hash of block 1412-1, thus forming a hash of hashes. Block 1404 includes an RSA signature for the entire block.

Similarly, block 1402-M includes blocks 1416-M1 through 1416-MN. Block 1412-M includes the individual hashes of each of blocks 1416-M1 through 1416-MN. Block 1408-M includes a hash of block 1412-M, thus forming a hash of hashes. Finally, block 1402-M is signed by RSA signature 1404-N.

Thus, each test sequence includes one or more block groups. Within each block group 1402, one or more HVM tests are stored, for example in ciphertext, in IFST blocks 1412.

Figure 15:
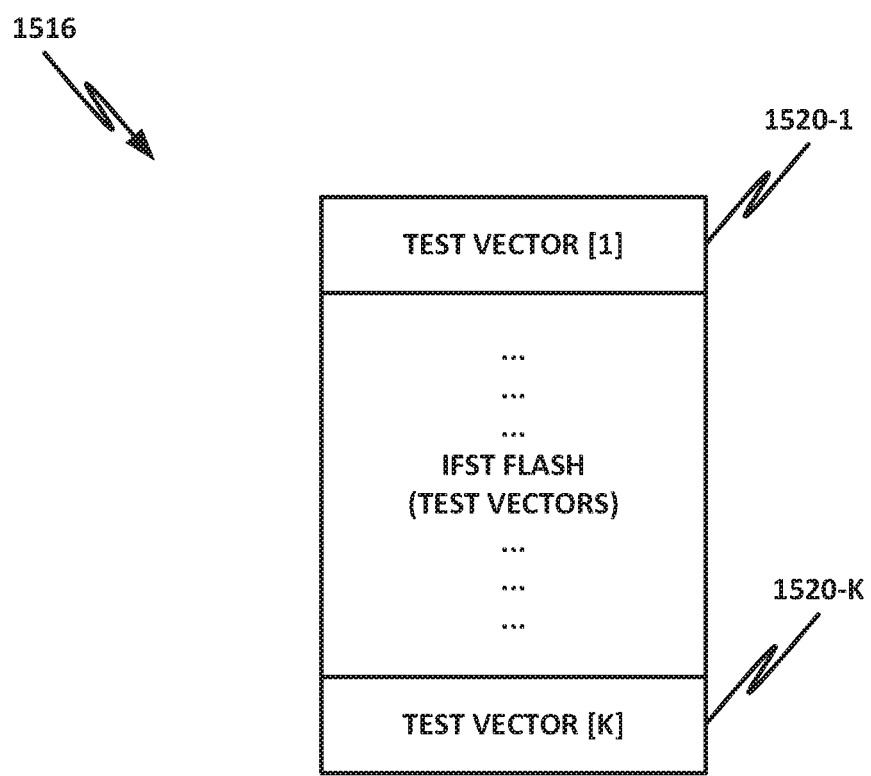
FIG. 15 illustrates an example IFST block.

FIG. 15 illustrates an example of such an IFST block. In this example, block 1516 includes test vectors 1520-1 through 1520-K.

These may form a number of HVM-like tests.

In one embodiment, because of physical storage restraints, each block 1416 may be of a fixed 4 KB size. However, this should be understood to be a nonlimiting example, and other embodiments may include larger or smaller block sizes, or dynamic block sizes.

In the embodiment with a fixed 4 KB block size, each test vector is divided into 4 KB blocks, and encrypted using, in one example, symmetric encryption such as the advanced encryption standard (AES). Each 4 KB block 1416 is hashed, generating a unique 32-byte digital fingerprint for that block which is stored in field 1412. In an example, there are 128 blocks 1416 per block group 1402, and thus 128 unique hashes, each of 32 bytes, stored in field 1412. When the entire field 1412 is populated, this field is hashed to build hash of hashes 1408. This 32-byte hash of hashes, forming a unique digital fingerprint for this block group 1402, may be signed using the manufacturer's RSA private key, and the RSA signature is stored for each block group.

Note that RSA 2048 requires inputs to be fixed at 2048 bits, and thus a padding scheme may be used to pad the 32-byte input to produce 256 bytes as needed. This may be a National Institute of Standards and Technology (NIST)-approved Public Key Cryptography Standards (PKCS) 1.5 padding scheme, as defined in RFC 3447 or RFC 8017, or any other suitable padding scheme.

This process is repeated to cover all test vectors, thus providing a single unique RSA signature for each block group. This signature, along with the manufacturer's RSA public key, may then be used to authenticate and verify the test vectors on an IFST controller in hardware.

The foregoing outlines features of several embodiments so that those skilled in the art may better understand various aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

All or part of any hardware element disclosed herein may readily be provided in a system-on-a-chip (SoC), including central processing unit (CPU) package. An SoC represents an integrated circuit (IC) that integrates components of a computer or other electronic system into a single chip. The SoC may contain digital, analog, mixed-signal, and radio frequency functions, all of which may be provided on a single chip substrate. Other embodiments may include a multichip module (MCM), with a plurality of chips located within a single electronic package and configured to interact closely with each other through the electronic package. In various other embodiments, the computing functionalities disclosed herein may be implemented in one or more silicon cores in application-specific integrated circuits (ASICs), field-programmable gate arrays (FPGAs), and other semiconductor chips.

As used throughout this specification, the term "processor" or "microprocessor" should be understood to include not only a traditional microprocessor (such as Intel's® industry-leading x86 and x64 architectures), but also any ASIC, FPGA, microcontroller, digital signal processor (DSP), programmable logic device, programmable logic array (PLA), microcode, instruction set, emulated or virtual machine processor, or any similar "Turing-complete" device, combination of devices, or logic elements (hardware or software) that permit the execution of instructions.

Note also that in certain embodiments, some of the components may be omitted or consolidated. In a general sense, the arrangements depicted in the figures should be understood as logical divisions, whereas a physical architecture may include various permutations, combinations, and/or hybrids of these elements. It is imperative to note that countless possible design configurations can be used to achieve the operational objectives outlined herein. Accordingly, the associated infrastructure has a myriad of substitute arrangements, design choices, device possibilities, hardware configurations, software implementations, and equipment options.

In a general sense, any suitably-configured processor can execute instructions associated with data or microcode to achieve the operations detailed herein. Any processor disclosed herein could transform an element or an article (for example, data) from one state or thing to another state or thing. In another example, some activities outlined herein may be implemented with fixed logic or programmable logic (for example, software and/or computer instructions executed by a processor) and the elements identified herein could be some type of a programmable processor, programmable digital logic (for example, a field-programmable gate array (FPGA), an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof.

In operation, a storage may store information in any suitable type of tangible, nontransitory storage medium (for example, random access memory (RAM), read only memory (ROM), field programmable gate array (FPGA), erasable programmable read only memory (EPROM), electrically erasable programmable ROM (EEPROM), or microcode), software, hardware (for example, processor instructions or microcode), or in any other suitable component, device, element, or object where appropriate and based on particular needs. Furthermore, the information being tracked, sent, received, or stored in a processor could be provided in any database, register, table, cache, queue, control list, or storage structure, based on particular needs and implementations, all of which could be referenced in any suitable timeframe. Any of the memory or storage elements disclosed herein should be construed as being encompassed within the broad terms 'memory' and 'storage,' as appropriate. A nontransitory storage medium herein is expressly intended to include any nontransitory special-purpose or programmable hardware configured to provide the disclosed operations, or to cause a processor to perform the disclosed operations. A nontransitory storage medium also expressly includes a processor having stored thereon hardware-coded instructions, and optionally microcode instructions or sequences encoded in hardware, firmware, or software.

Computer program logic implementing all or part of the functionality described herein is embodied in various forms, including, but in no way limited to, hardware description language, a source code form, a computer executable form, machine instructions or microcode, programmable hardware, and various intermediate forms (for example, forms generated by an HDL processor, assembler, compiler, linker, or locator). In an example, source code includes a series of computer program instructions implemented in various programming languages, such as an object code, an assembly language, or a high-level language such as OpenCL, FORTRAN, C, C++, JAVA, or HTML for use with various operating systems or operating environments, or in hardware description languages such as Spice, Verilog, and VHDL. The source code may define and use various data structures and communication messages. The source code may be in a computer executable form (e.g., via an interpreter), or the source code may be converted (e.g., via a translator, assembler, or compiler) into a computer executable form, or converted to an intermediate form such as byte code. Where appropriate, any of the foregoing may be used to build or describe appropriate discrete or integrated circuits, whether sequential, combinatorial, state machines, or otherwise.

In one example, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processor and memory can be suitably coupled to the board based on particular configuration needs, processing demands, and computing designs. Other components such as external storage, additional sensors, controllers for audio/video display, and peripheral devices may be attached to the board as plug-in cards, via cables, or integrated into the board itself. In another example, the electrical circuits of the FIGURES may be implemented as stand-alone modules (e.g., a device with associated components and circuitry configured to perform a specific application or function) or implemented as plug-in modules into application specific hardware of electronic devices.

Note that with the numerous examples provided herein, interaction may be described in terms of two, three, four, or more electrical components. However, this has been done for purposes of clarity and example only. It should be appreciated that the system can be consolidated or reconfigured in any suitable manner. Along similar design alternatives, any of the illustrated components, modules, and elements of the FIGURES may be combined in various possible configurations, all of which are within the broad scope of this specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph (f) of 35 U.S.C. section 112, as it exists on the date of the filing hereof, unless the words "means for" or "steps for" are specifically used in the particular claims; and (b) does not intend, by any statement in the specification, to limit this disclosure in any way that is not otherwise expressly reflected in the appended claims.

EXAMPLE IMPLEMENTATIONS

There is disclosed in one example, a processor, comprising: a core; system test circuitry, the system test circuitry to be locked during operational processor operation; reset circuitry comprising a kick-off test (KOT) input, the reset circuitry to detect a reset with the KOT input asserted, and to initiate an in-field system test (IFST) mode; a test interface controller to receive in IFST mode an encrypted test packet having a signature, verify the signature of the test packet, and decrypt the test packet; and IFST control circuitry to cause the system test circuitry to perform an IFST test according to the decrypted test packet and to log or report results.

There is further disclosed a processor, wherein the test interface controller is further to determine that the signature of the encrypted test packet is invalid, and to log an error to the results buffer without aborting a test sequence that the test packet is associated with.

There is further disclosed a processor, wherein the test interface controller is further to determine that decryption of the encrypted test packet failed, and to log an error to the results buffer without aborting a test sequence that the test packet is associated with.

There is further disclosed a processor, wherein the test interface controller is to determine that decryption of the encrypted test packet failed or that the signature of the encrypted test packet is invalid, and to log an error to the results buffer while aborting a test sequence that the test packet is associated with.

There is further disclosed a processor, wherein the reset logic is further to force a reset upon de-assertion of the KOT input.

There is further disclosed a processor, wherein the test interface controller is further to disable input/output ports of the processor while in the IFST mode.

There is further disclosed a processor, wherein the test interface controller is further to disable all input/output ports of the processor, excepting the test interface controller and an interface to read the results buffer, while in the IFST mode.

There is further disclosed a processor, comprising an IFST enable fuse, wherein the reset logic is to enter the IFST mode only if the IFST enable fuse is set.

There is further disclosed a processor, wherein the test result buffer is an IFST status register (ISR).

There is further disclosed a processor, comprising a platform environment control interface to read the ISR.

There is further disclosed a test system, comprising a test controller communicatively coupled to a processor, the test controller further comprising a test memory to store the encrypted test packet.

There is also disclosed a system on a chip, comprising: one or more cores; an uncore; and an in-field system test engine, comprising: system test circuitry, the system test circuitry to be locked during operational processor operation; reset circuitry comprising a kick-off test (KOT) input, the reset circuitry to detect a reset with the KOT input asserted, and to initiate an in-field system test (IFST) mode; a test interface controller to receive in IFST mode an encrypted test packet having a signature, verify the signature of the test packet, and decrypt the test packet; and IFST control circuitry to cause the system test circuitry to perform an IFST test according to the decrypted test packet and to log or report results.

There is further disclosed a system on a chip, wherein the test interface controller is further to determine that the signature of the encrypted test packet is invalid, and to log an error to the results buffer without aborting a test sequence that the test packet is associated with.

There is further disclosed a system on a chip, wherein the test interface controller is further to determine that decryption of the encrypted test packet failed, and to log an error to the results buffer without aborting a test sequence that the test packet is associated with.

There is further disclosed a system on a chip, wherein the test interface controller is to determine that decryption of the encrypted test packet failed or that the signature of the encrypted test packet is invalid, and to log an error to the results buffer while aborting a test sequence that the test packet is associated with.

There is further disclosed a system on a chip, wherein the reset logic is further to force a reset upon de-assertion of the KOT input.

There is further disclosed a system on a chip, wherein the test interface controller is further to disable input/output ports of the processor while in the IFST mode.

There is further disclosed a system on a chip, wherein the test interface controller is further to disable all input/output ports of the processor, excepting the test interface controller and an interface to read the results buffer, while in the IFST mode.

There is further disclosed a system on a chip, further comprising an IFST enable fuse, wherein the reset logic is to enter the IFST mode only if the IFST enable fuse is set.

There is further disclosed a system on a chip, wherein the test result buffer is an IFST status register (ISR).

There is further disclosed a system on a chip, further comprising a platform environment control interface to read the ISR.

There is further disclosed a test system, comprising a test controller communicatively coupled to the system on a chip, the test controller further comprising a test memory to store the encrypted test packet.

There is also disclosed an in-field system test (IFST) apparatus, comprising: a test memory comprising a test sequence comprising a sequence of test packets, the test packets encrypted and signed; and a test controller to:
communicatively couple to a core-under-test (CUT); assert a kick-off test (KOT) pin; issue a reset to the CUT; send a first test packet to CUT; determine that the CUT has completed processing the first test packet; send a second test packet to the CUT; determine that the CUT has completed processing the second test packet; read a test result buffer; and reset the CUT.

There is further disclosed an IFST apparatus, wherein determining that the CUT has completed processing a test packet comprises determining that a DIAG pin has been de-asserted by the CUT.

There is further disclosed an IFST apparatus, wherein the test result buffer is an IFST status register (ISR).

There is further disclosed an IFST apparatus, wherein to read the test result buffer comprises causing a platform environment control interface (PECI) to read the ISR.

There is further disclosed an IFST apparatus, wherein to send test packets to the CUT comprises sending the test packets via a strobe bus.

There is further disclosed an IFST apparatus, comprising sockets to support testing a plurality of CUTs simultaneously.

There is further disclosed an IFST apparatus, comprising sockets to support testing up to eight CUTs simultaneously.

There is also disclosed an example of a method of performing in-field system testing (IFST) on a core, comprising: receiving a reset signal with a kick-off test (KOT) input asserted; initiating an IFST mode; receiving in the IFST mode an encrypted test packet having a signature; verifying the signature of the test packet; decrypting the test packet; and performing an IFST test according to the decrypted test packet; and logging or reporting results.

There is further disclosed an example of a method of performing in-field system testing, further comprising determining that the signature of the encrypted test packet is invalid, and logging or reporting an error without aborting a test sequence that the test packet is associated with.

There is further disclosed an example of a method of performing in-field system testing, further comprising determining that decryption of the encrypted test packet failed, and logging or reporting an error without aborting a test sequence that the test packet is associated with.

There is further disclosed an example of a method of performing in-field system testing, further comprising determining that decryption of the encrypted test packet failed or that the signature of the encrypted test packet is invalid, and logging or reporting an error while aborting a test sequence that the test packet is associated with.

There is further disclosed an example of a method of performing in-field system testing, further comprising forcing a reset upon de-assertion of the KOT input.

There is further disclosed an example of a method of performing in-field system testing, further comprising disabling input/output ports of the core while in the IFST mode.

There is further disclosed an example of a method of performing in-field system testing, further comprising disabling input/output ports of the processor, excepting a test interface controller and an interface to read the results, while in the IFST mode.

There is further disclosed an example of a method of performing in-field system testing, further comprising entering the IFST mode only if an IFST enable fuse is set.

There is further disclosed an example of a method of performing in-field system testing, wherein logging the results comprises logging the results to an IFST status register (ISR).

There is further disclosed an example of an apparatus comprising means for performing the method of a number of the preceding examples.

There is further disclosed an example of an apparatus, wherein the means for performing the method comprise a processor and a memory.

There is further disclosed an example of an apparatus, wherein the memory comprises machine-readable instructions, that when executed cause the apparatus to perform the method of a number of the preceding examples.

There is further disclosed an example of an apparatus, wherein the apparatus is a computing system.

There is further disclosed an example of at least one computer readable medium comprising instructions that, when executed, implement a method or realize an apparatus as claimed in a number of the preceding examples.

What is claimed is:

1. A processor, comprising:
    a core;
    system test circuitry, the system test circuitry to be locked during operational processor operation;
    reset circuitry comprising a kick-off test (KOT) input, the reset circuitry to detect a reset with the KOT input asserted, and to initiate an in-field system test (IFST) mode;
    a test interface controller to receive in IFST mode an encrypted test packet having a signature, verify the signature of the test packet, and decrypt the test packet; and
    IFST control circuitry to cause the system test circuitry to perform an IFST test according to the decrypted test packet and to log or report results.

2. The processor of claim 1, wherein the test interface controller is further to determine that the signature of the encrypted test packet is invalid, and to log an error to the results buffer without aborting a test sequence that the test packet is associated with.

3. The processor of claim 1, wherein the test interface controller is further to determine that decryption of the encrypted test packet failed, and to log an error to the results buffer without aborting a test sequence that the test packet is associated with.

4. The processor of claim 1, wherein the test interface controller is to determine that decryption of the encrypted test packet failed or that the signature of the encrypted test packet is invalid, and to log an error to the results buffer while aborting a test sequence that the test packet is associated with.

5. The processor of claim 1, wherein the reset logic is further to force a reset upon de-assertion of the KOT input.

6. The processor of claim 1, wherein the test interface controller is further to disable input/output ports of the processor while in the IFST mode.

7. The processor of claim 1, wherein the test interface controller is further to disable all input/output ports of the processor, excepting the test interface controller and an interface to read the results buffer, while in the IFST mode.

8. The processor of claim 1, further comprising an IFST enable fuse, wherein the reset logic is to enter the IFST mode only if the IFST enable fuse is set.

9. The processor of claim 1, wherein the test result buffer is an IFST status register (ISR).

10. The processor of claim 9, further comprising a platform environment control interface to read the ISR.

11. A test system, comprising a test controller communicatively coupled to the processor of claim 1, the test controller further comprising a test memory to store the encrypted test packet.

12. A system on a chip, comprising:
    one or more cores;
    an uncore; and
    an in-field system test engine, comprising:
        system test circuitry, the system test circuitry to be locked during operational processor operation;
        reset circuitry comprising a kick-off test (KOT) input, the reset circuitry to detect a reset with the KOT input asserted, and to initiate an in-field system test (IFST) mode;
        a test interface controller to receive in IFST mode an encrypted test packet having a signature, verify the signature of the test packet, and decrypt the test packet; and
        IFST control circuitry to cause the system test circuitry to perform an IFST test according to the decrypted test packet and to log or report results.

13. The system on a chip of claim 12, wherein the test interface controller is further to determine that the signature of the encrypted test packet is invalid, and to log an error to the results buffer without aborting a test sequence that the test packet is associated with.

14. The system on a chip of claim 12, wherein the test interface controller is further to determine that decryption of the encrypted test packet failed, and to log an error to the results buffer without aborting a test sequence that the test packet is associated with.

15. The system on a chip of claim 12, wherein the test interface controller is to determine that decryption of the encrypted test packet failed or that the signature of the encrypted test packet is invalid, and to log an error to the results buffer while aborting a test sequence that the test packet is associated with.

16. The system on a chip of claim 12, wherein the reset logic is further to force a reset upon de-assertion of the KOT input.

17. The system on a chip of claim 12, wherein the test interface controller is further to disable input/output ports of the processor while in the IFST mode.

18. The system on a chip of claim 12, wherein the test interface controller is further to disable all input/output ports of the processor, excepting the test interface controller and an interface to read the results buffer, while in the IFST mode.

19. The system on a chip of claim 12, further comprising an IFST enable fuse, wherein the reset logic is to enter the IFST mode only if the IFST enable fuse is set.

20. The system on a chip of claim 12, wherein the test result buffer is an IFST status register (ISR).

21. The system on a chip of claim 20, further comprising a platform environment control interface to read the ISR.

22. A test system, comprising a test controller communicatively coupled to the system on a chip of claim 12, the test controller further comprising a test memory to store the encrypted test packet.

23. An in-field system test (IFST) apparatus, comprising:
    a test memory comprising a test sequence comprising a sequence of test packets, the test packets encrypted and signed; and
    a test controller to:
        communicatively couple to a core-under-test (CUT);
        assert a kick-off test (KOT) pin;
        issue a first reset to the CUT;

send the sequence of test packets to the CUT over a strobe bus;
determine that the CUT has completed processing the sequence of test packets;
read a test result buffer;
de-assert the KOT pin; and
issue a second reset to the CUT based on de-assertion of the KOT pin.

24. The IFST apparatus of claim 23, wherein the test controller is further to determine that the CUT has asserted a DIAG pin, the first test packet is sent to the CUT based on a determination that the DIAG pin has been asserted, and the test controller is to determine that the CUT has completed processing a test packet based on determining that the DIAG pin has been de-asserted by the CUT.

25. The IFST apparatus of claim 23, wherein the test result buffer is an IFST status register (ISR) of a platform control host (PCH) coupled to the test controller.

* * * * *